(12) United States Patent
Miyauchi et al.

(10) Patent No.: US 8,401,126 B2
(45) Date of Patent: Mar. 19, 2013

(54) VITERBI DECODING APPARATUS

(75) Inventors: Toshiyuki Miyauchi, Tokyo (JP); Yuichi Mizutani, Tokyo (JP)

(73) Assignee: Sony Corporation, Tokyo (JP)

( * ) Notice: Subject to any disclaimer, the term of this patent is extended or adjusted under 35 U.S.C. 154(b) by 1119 days.

(21) Appl. No.: 11/473,126

(22) Filed: Jun. 23, 2006

(65) Prior Publication Data
US 2007/0104296 A1 May 10, 2007

(30) Foreign Application Priority Data

Jun. 28, 2005 (JP) .............................. P2005-188846

(51) Int. Cl.
*H04B 1/66* (2006.01)

(52) U.S. Cl. ...................................................... 375/341
(58) Field of Classification Search .................. 375/262, 375/265, 270, 277, 316, 341, 340; 714/795, 714/780, 791, 792, 794; 371/43
See application file for complete search history.

(56) References Cited

U.S. PATENT DOCUMENTS

| | | | | |
|---|---|---|---|---|
| 5,923,713 | A * | 7/1999 | Hatakeyama | 375/341 |
| 6,094,739 | A * | 7/2000 | Miller et al. | 714/792 |
| 6,317,472 | B1 * | 11/2001 | Choi et al. | 375/341 |
| 6,324,226 | B1 * | 11/2001 | Sasagawa | 375/341 |
| 2001/0049809 | A1 * | 12/2001 | Miyauchi et al. | 714/796 |
| 2002/0012307 | A1 | 1/2002 | Imai et al. | |
| 2004/0261005 | A1 | 12/2004 | Lee et al. | |
| 2006/0168501 | A1 * | 7/2006 | Cho et al. | 714/795 |

FOREIGN PATENT DOCUMENTS

| | | |
|---|---|---|
| EP | 0 899 887 A2 | 3/1999 |
| JP | 11-186920 | 7/1999 |
| JP | 2001-186025 | 7/2001 |
| JP | 2001-186026 | 7/2001 |
| JP | 2004-153319 | 5/2004 |

OTHER PUBLICATIONS

Machine translation of Yoshifumi (JP 2001-186025).*
Extended European Search Report of Application No. EP 06 25 3258, dated Nov. 4, 2011 (10 pages).
Chien-Ching Lin et al., "A Low Power and High Speed Viterbi Decoder Chip for WLAN Applications," IEEE, Proc. Conference on European Solid-State Circuit 2003, p. 723-726.

* cited by examiner

*Primary Examiner* — Kevin M Burd
(74) *Attorney, Agent, or Firm* — Finnegan, Henderson, Farabow, Garrett & Dunner LLP

(57) ABSTRACT

The present invention can reduce power consumption at the time of tracing. The present invention provides a viterbi decoding apparatus for decoding convolution codes, which includes a path memory unit that stores one of two paths toward respective transition states of a convolution code, as a selected path, for a plurality of continuous time points, a tracing unit that traces a selected path stored in the path memory unit in a reversed-time direction, thereby decoding a convolution code at respective time points, each of the time points being prior to a predetermined trace-skipping period, and a control unit that controls the path memory unit, wherein the path memory unit has a storage area designed to store selected paths assuming respective transition states at respective time points, the storage area is divided into sub-areas from the lowest order of transition state, each of the sub-areas corresponding to predetermined number of bits, and reading data can be stopped for each sub-area, and the control unit designates sub-areas from which no selected path needs to be read at respective time points so as to stop reading data from the designated sub-areas.

4 Claims, 24 Drawing Sheets

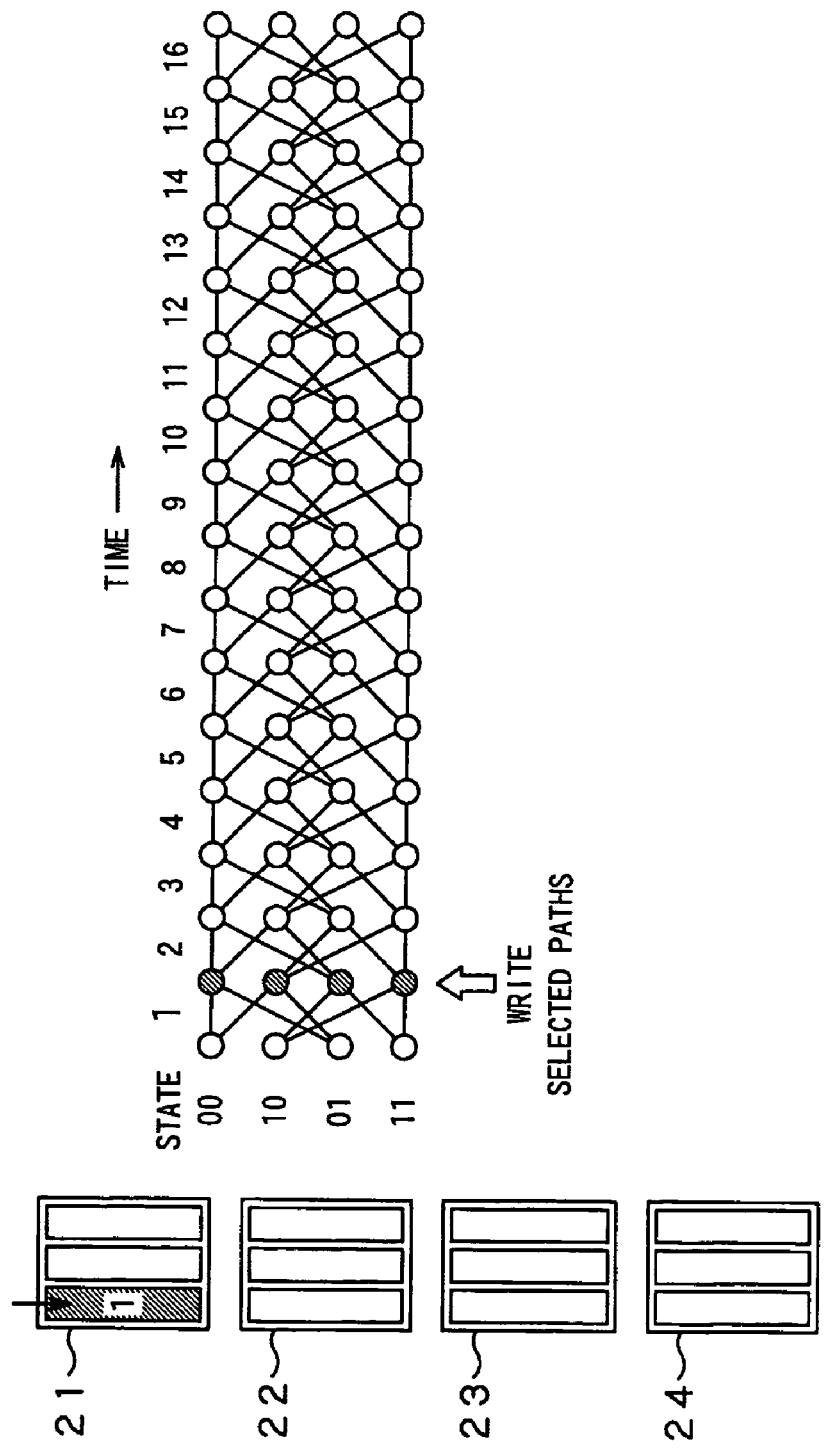

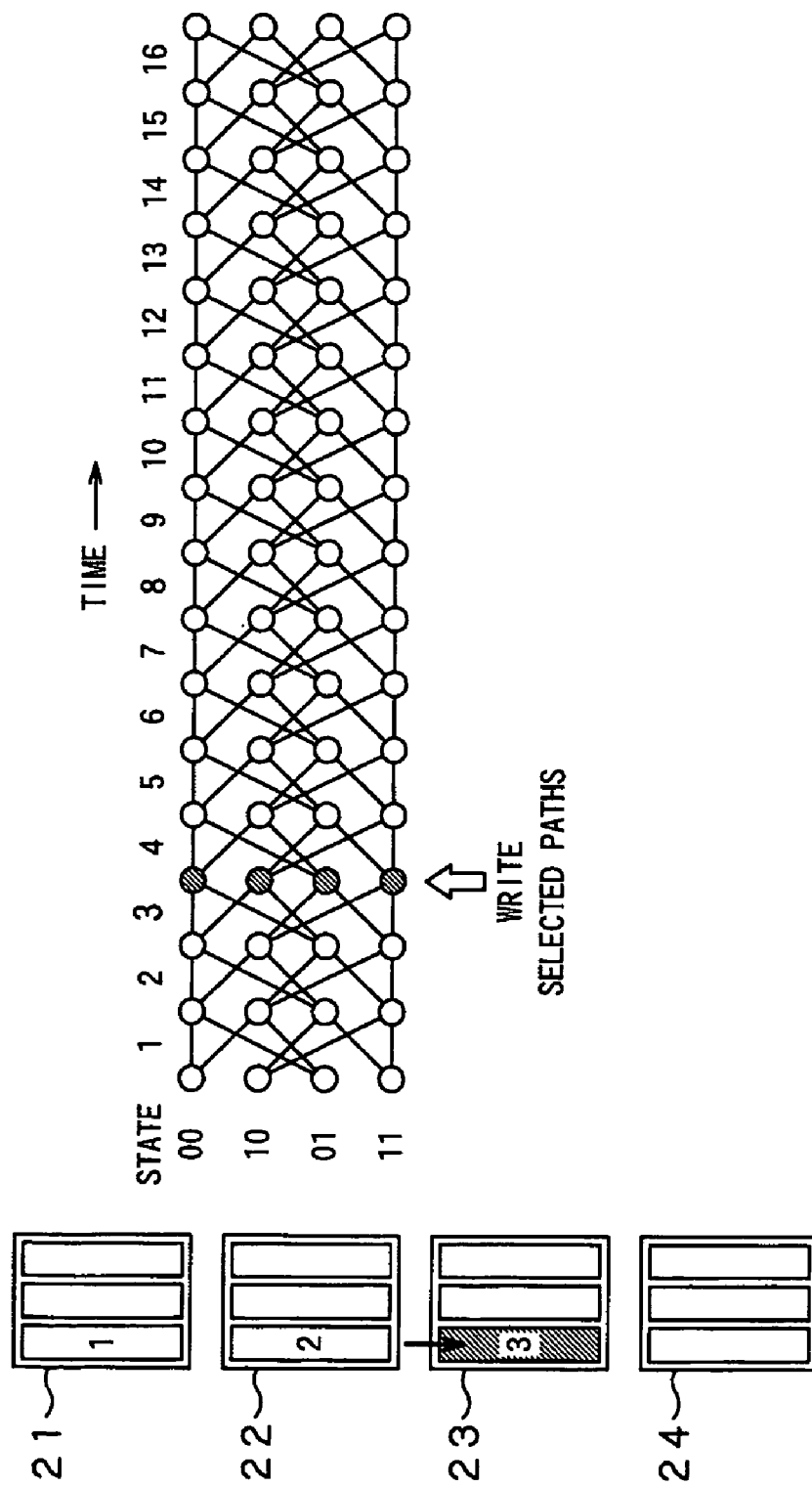

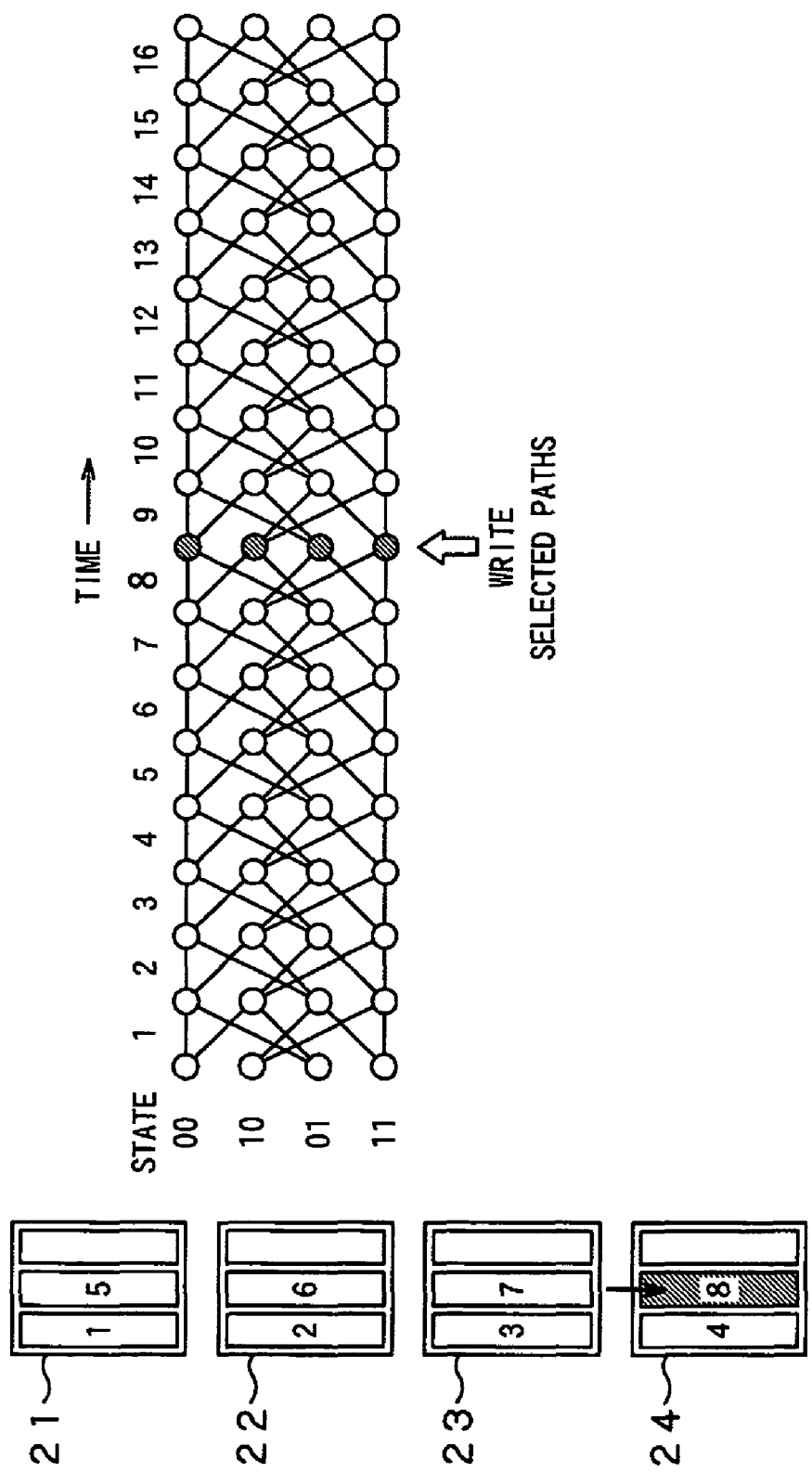

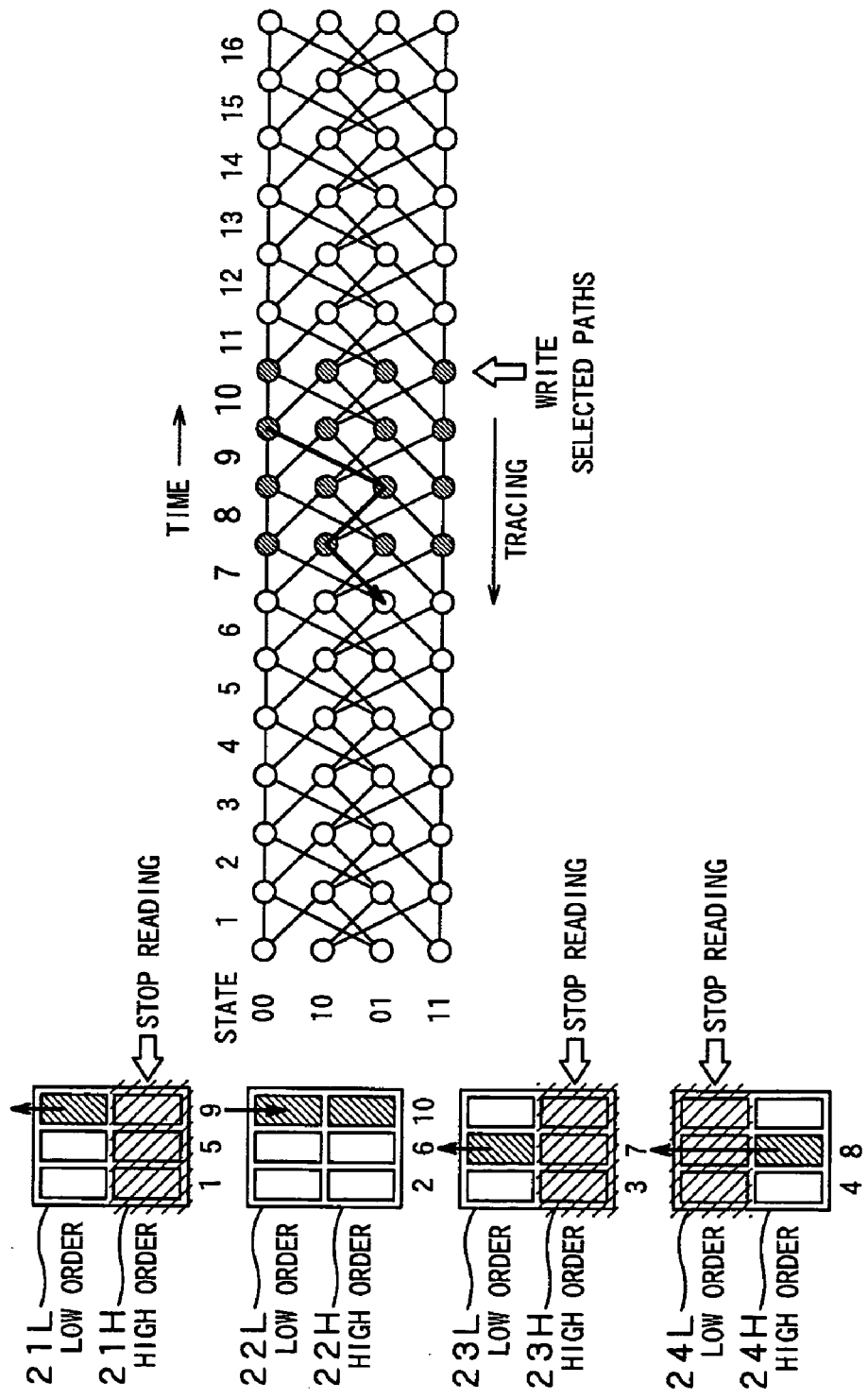

VITERBI DECODING APPARATUS

CROSS REFERENCE TO RELATED APPLICATIONS

The present invention contains subject matter related to Japanese Patent Application JP 2005-188846 filed in the Japanese Patent Office on Jun. 28, 2005, the entire contents of which being incorporated herein by reference.

BACKGROUND OF THE INVENTION

1. Field of the Invention

The present invention relates to a viterbi decoding apparatus for use in the maximum-likelihood method for decoding convolution codes in, for example, satellite broadcasting.

2. Description of the Related Art

Viterbi decoding is known as one of methods for decoding convolution codes. The viterbi decoding is a decoding method that can achieve maximum likelihood decoding by processing a small amount of data.

FIG. 1 is a transition diagram (trellis diagram) that shows how convolution codes transfer if the constraint length applied is 4.

As FIG. 1 shows, a convolution code transfers from the transition state it assumes at a specific time, to a new, next transition state, when new information (1 bit) is input. (The transition state, also known as "state," corresponds to the bit train that the memory elements of a convolution encoder stores at the specific time.) New information is either 0 or 1. Hence, the convolution code transfers to one of only two states from the transition state it assumes at the specific time. That is, there are only two paths through which the convolution code can transfer from one time point to another.

Of the two paths through which a convolution code transfers to any one of all possible transition states, the path having higher likelihood is selected in the viterbi decoding. To be more specific, two paths that are connected at a particular transition state are compared in terms of the Hamming distance (branch metric) between the signal received and the path and the cumulative sum (state metric) of branch metrics hitherto obtained. Then, of the two paths, the path having higher likelihood is selected for the transition state. The path thus selected is temporarily stored in a path memory circuit. This sequence of operations is repeated for a prescribed time (or performed at a plurality of times), and the results obtained are stored in the path memory circuit. That is, the path memory circuit stores the paths, each selected when the sequence of operations is performed. In the path memory circuit, the selected paths are traced, one after another, thereby finding two paths are more likely to be connected, than any other pair of paths. On the basis of the two paths thus found, the result of decoding is output.

The longer the time for which the selected paths are traced, the smaller the decoding error will be. However, the memory circuit has but a limited storage capacity, and the decoding apparatus used is limited in terms of computing ability. Inevitably, the path tracing is skipped for a specific period, and the decoding result is output. This specific period is called "cutoff period."

In most cases, the hardware implementation of the path memory circuit is achieved by using a RAM, which stores the selected paths. The paths stored in the memory circuit are traced in a reversed-time direction. (See Jpn. Pat, Appln. Laid-Open Publication No. 2004-153319, Jpn. Pat, Appln. Laid-Open Publication No. 11-186920, and Jpn. Pat, Appln. Laid-Open Publication No. 2001-186026.) This method will hereinafter be referred to as trace-back method.

A trace-back method, in which a constraint length of 4 is applied in performing the path tracing, will be explained with reference to FIG. 2. Assume that the tracing is started at state 001. A convolution code in state 001 can transfer to states, i.e., state 000 and state 100. The path memory circuit stores 0 if a path leading to state 000 has been selected. It stores 1 (i.e., the most significant bit for the previous state) if a path leading to state 100 has been selected. The input is 1, whichever state the convolution code transfers from. This is expressed by the least significant bit for state 001. Thus, the tracing may be carried out as follows.

The least significant bit of the state being traced at present is used as decoding bit. The number of the state to be traced next is generated by adding, as new least significant bit, one of the bits stored in the path memory circuit, i.e., the most significant bit to the second least significant bit, all stored in the current trace state (see FIG. 3). The selected paths can therefore be traced back in sequence, starting with the state that assumes the minimum state metric.

To make the viterbi decoding apparatus operate at high speed, each RAM incorporated in the apparatus can be accessed only once during each clock cycle. How a path memory composed of, for example, four single-port memories operates in decoding a viterbi code by accessing each RAM only once will be explained below.

Assume that the constraint length of codes is set to 4 and cutoff period is set to 6. Four single-port RAMs are prepared, each having as many bits as states (8 bits in this case) and a number of words that corresponds to the cutoff period (6 words in this case). The path memory circuit receives as many selection data items as states, from a path-selecting circuit, during each clock cycle. The four RAMs switch the following four functions, from one to another, upon receiving clock pulses (6 pulses in this case) that correspond to the trace-skipping period, as is illustrated in FIG. 4.

(1) To write path-selection data items in sequence
(2) To trace the selected paths in accordance with the path-selection data items written, and not to decode codes
(3) To perform no accessing
(4) To perform tracing based on the result of function 2, i.e., tracing, and to output decoding bits FIG. 5 is a diagram explaining how the RAMs operate when this memory operation is carried out.

The memory operation described above helps to constitute a viterbi decoding apparatus that can decode codes at high speed even if it used RAMs

SUMMARY OF THE INVENTION

In a viterbi decoding apparatus that performs the trace-back method, most of the power consumed is used to read data from the memory in order to trace the selected paths. To save power it is necessary to reduce the power consumption in reading data from the memory.

The present invention has been made in consideration of the foregoing. It is desirable to provide reduce power consumption in a viterbi decoding apparatus that includes a path memory circuit.

According to the present invention, there is provided a viterbi decoding apparatus for decoding convolution codes, which includes a path memory unit that stores one of two paths toward respective transition states of a convolution code, as a selected path, for a plurality of continuous time points, a tracing unit that traces a selected path stored in the path memory unit in a reversed-time direction, thereby decoding a convolution code at respective time points, each of the time points being prior to a predetermined trace-skipping period, and a control unit that controls the path memory unit, wherein the path memory unit has a storage area designed to store selected paths assuming respective transition states at respective time points, the storage area is divided into sub-areas from the lowest order of transition state, each of the sub-areas corresponding to predetermined number of bits, and reading of data can be stopped for each sub-area, and the control unit designates sub-areas from which no selected path needs to be read at respective time points so as to stop the reading of data from the designated sub-areas.

In the viterbi decoding apparatus according to the invention, the storage area of the path memory unit is divided into sub-areas from the lowest order of a bit train that represents the transition state, each of the sub-areas corresponding to predetermined number, and it is possible to stop reading data for each sub-area. In the viterbi decoding apparatus, sub-areas from which no selected path needs to be read at respective time points are designated, thereby stopping reading data from the designated sub-areas.

Hence, unnecessary data-reading can be suppressed at the time of tracing in the viterbi decoding apparatus according to the present invention. This helps to reduce power consumption as much as possible.

BRIEF DESCRIPTION OF THE DRAWINGS

FIG. 9A is a diagram illustrating the data that is written into, and read from, memory units at time 1;

FIG. 9B is a trellis diagram showing the condition at time 1;

FIG. 10A is a diagram illustrating the data that is written into, and read from, the memory units at time 2;

FIG. 10B is a trellis diagram showing the condition at time 2;

FIG. 11A is a diagram illustrating the data that is written into, and read from, the memory units at time 3;

FIG. 11B is a trellis diagram showing the condition at time 3;

FIG. 16A is a diagram illustrating the data that is written into, and read from, the memory units at time 8;

FIG. 16B is a trellis diagram showing the condition at time 8;

FIG. 24A is a diagram showing how the data-reading is interrupted, with respect to each memory unit divided into a high-order RAM and a low-order RAM;

FIG. 24B is a trellis diagram showing the condition under which the data-reading is interrupted.

DETAILED DESCRIPTION OF THE PREFERRED EMBODIMENTS

A viterbi decoding apparatus according to this invention, or the best mode for carrying out this invention, will be described below.

Overall Configuration of the Viterbi Decoding Apparatus

Figure 1:
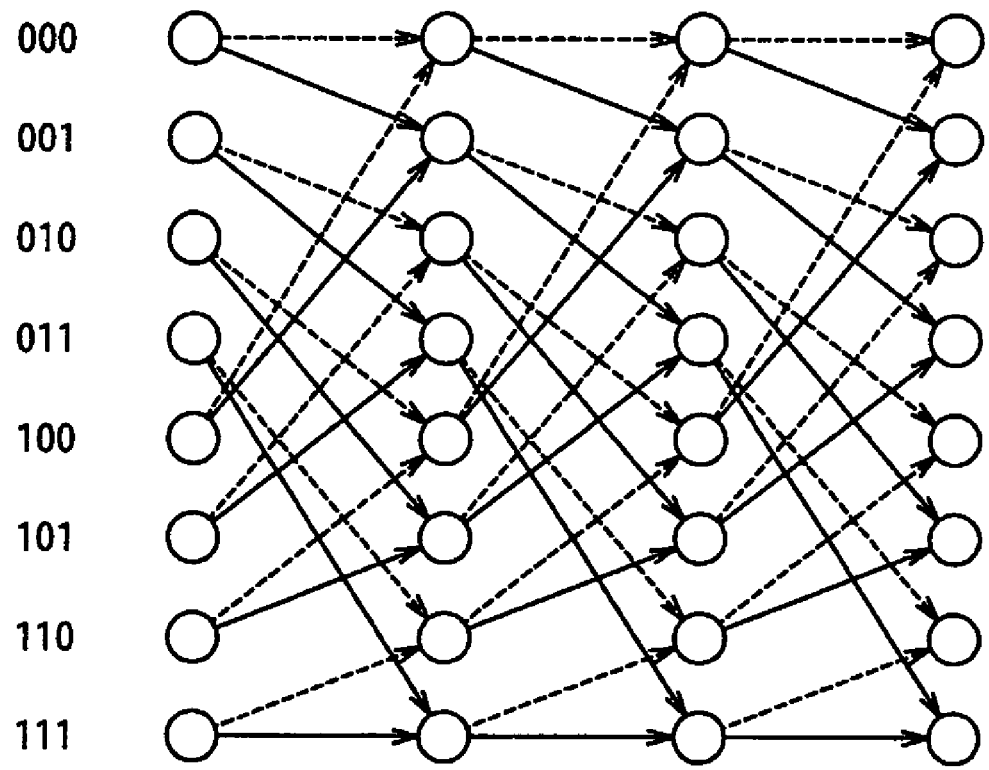
FIG. 1 is a transition diagram showing how convolution codes transfer if the constraint length applied is 4.
Figure 2:
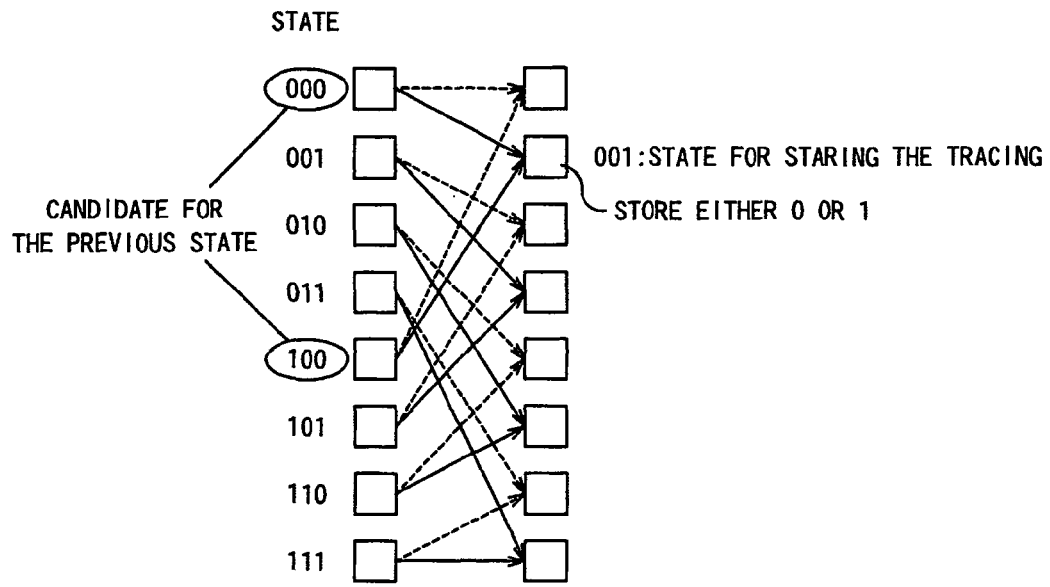
FIG. 2 is a diagram explaining the principle of tracing paths in the trace-back method.
Figure 3:
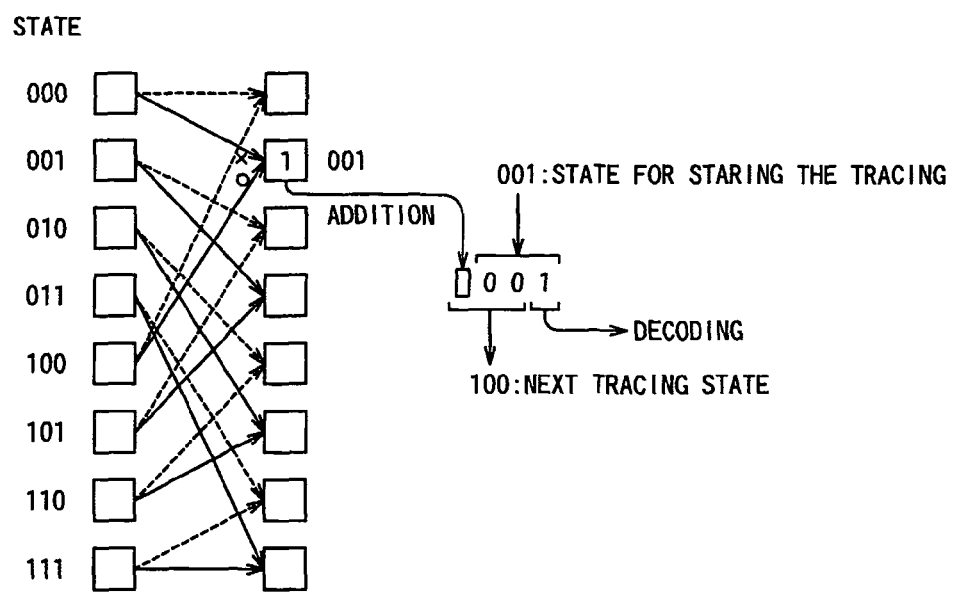
FIG. 3 is a diagram explaining the principle of tracing paths, too, more precisely the steps subsequent to those shown in FIG. 2.
Figure 4:
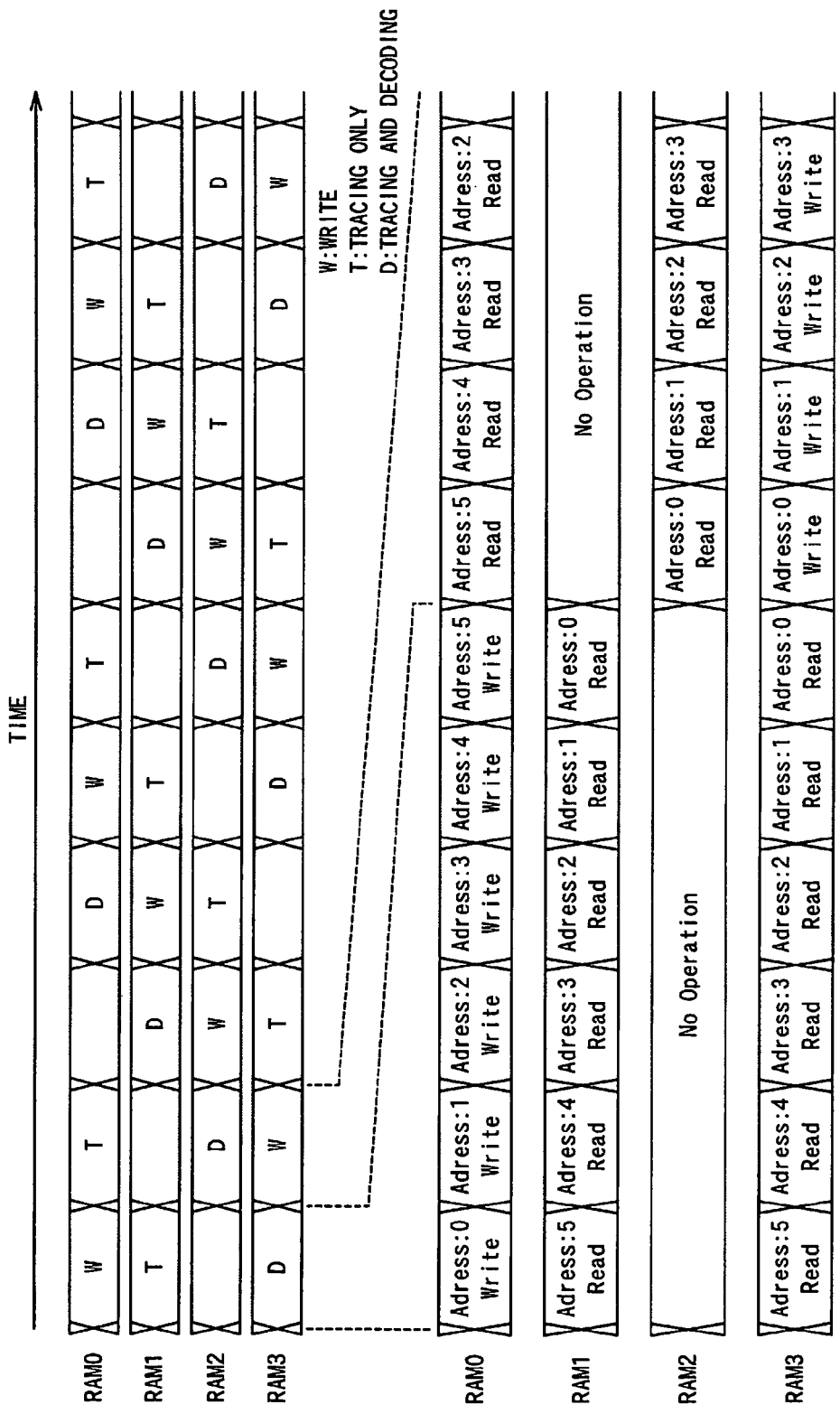
FIG. 4 is a chart that shows the role each RAM plays in the conventional trace-back method.
Figure 5:
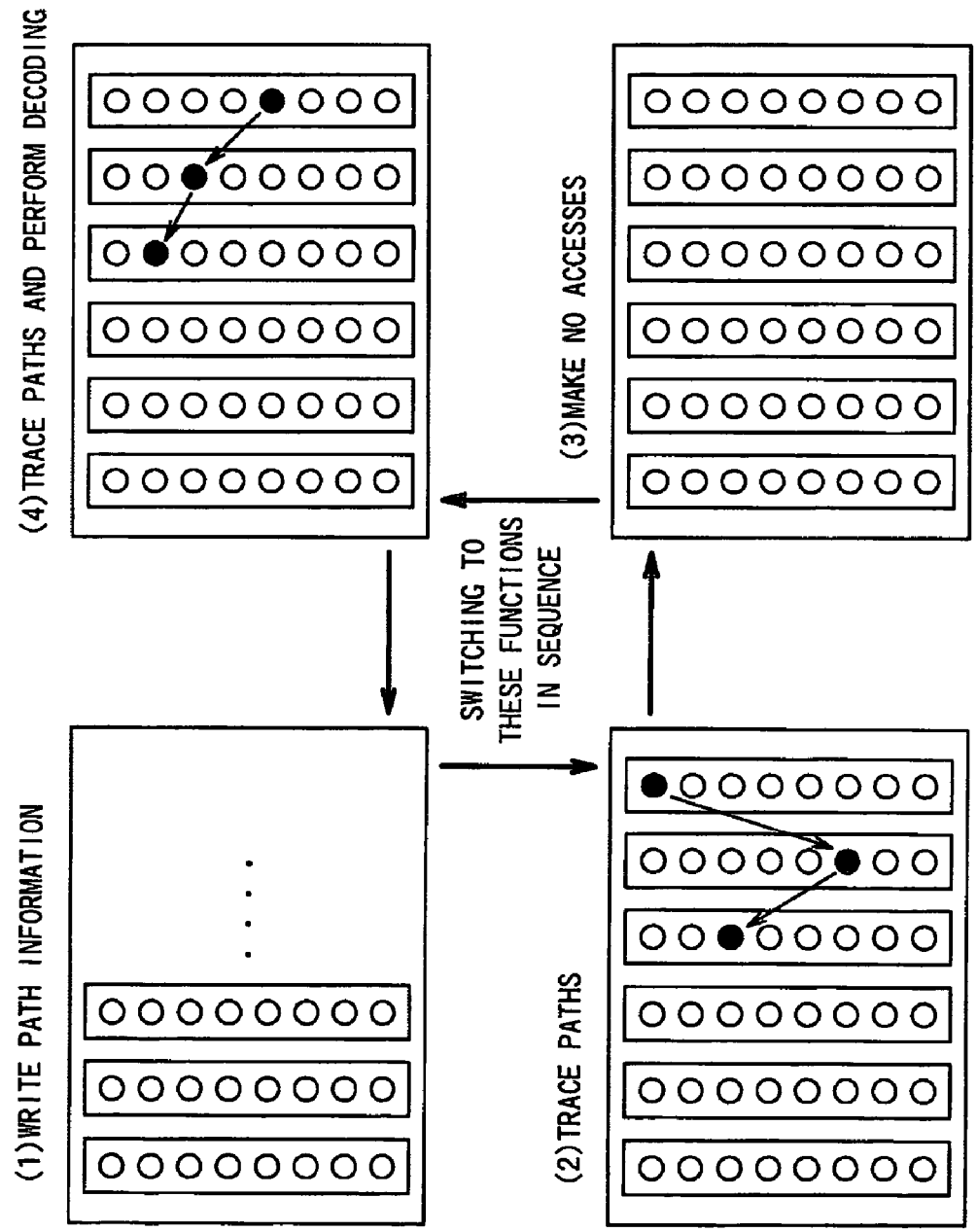
FIG. 5 is a diagram explaining an example of memory operation carried out in the conventional trace-back method.
Figure 6:
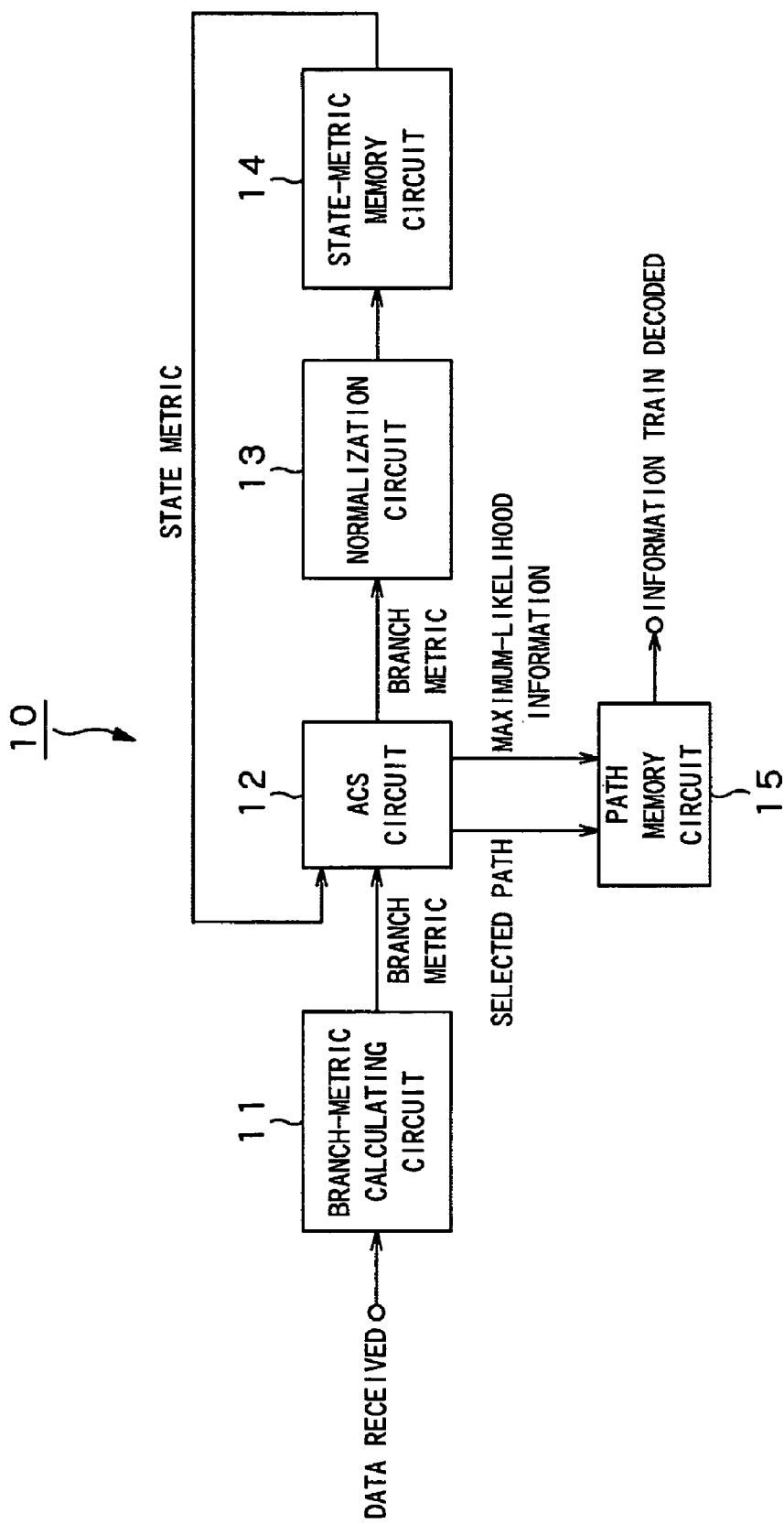
FIG. 6 is a block diagram of a viterbi decoding apparatus according to the present invention.

FIG. 6 is a block diagram of a viterbi decoding apparatus 10 according to the present invention.

As FIG. 6 shows, the viterbi decoding apparatus 10 includes a branch-metric calculating circuit 11, an add compare select (ACS) circuit 12, a normalization circuit 13, a state-metric memory circuit 14, and a path memory circuit 15.

The branch-metric calculating circuit 11 receives a signal. The branch-metric calculating circuit 11 finds a Hamming distance between the signal received at a specific time and the expected value for each transition state of a convolution code, or obtains a Euclidean distance. The circuit 11 then outputs the Hamming distance or the Euclidean distance as branch metric for each transition state at the time.

The ACS circuit 12 receives the branch metric from the branch-metric calculating circuit 11. It receives also the state metric from the state-metric memory circuit 14. (The state metric has been obtained by normalizing the cumulative sum of branch metrics generated up to the path.) The ACS circuit 12 adds the branch metric and the state metric for one path assuming a transition state to those for another path assuming a transition state. The ACS circuit 12 then compares the sum for one path with the sum for the other path. On the basis of the result of comparison, the ACS circuit 12 selects one of the two paths, which has higher likelihood than the other. The sum of the path thus selected is used as new state metric. The state metric output from the ACS circuit 12 is supplied to the normalization circuit 13.

Further, the ACS circuit 12 supplies maximum-likelihood information to the path memory circuit 15. The maximum-likelihood information represents the path selected for the transition state at the time and the transition state that has the highest likelihood at the time.

The normalization circuit 13 normalizes the state metric for each transition state, output from the ACS circuit 12, changing the state metric to a value that falls in a preset range. The circuit 13 normalizes the state metric by, for example, subtracting a minimum state metric from the state metric. The state metric thus normalized is supplied to the state-metric memory circuit 14.

The state-metric memory circuit 14 stores the state metric supplied from the normalization circuit 13. It outputs the state metric at the readout request made by the ACS circuit 12.

The path memory circuit 15 stores any selected path supplied from the ACS circuit 12. The path memory circuit 15 traces the selection paths stored in it in a reversed-time direction, decodes an information train that accord with the paths selected before the cutoff period expires, and outputs the information train thus decoded.

Configuration and Operation of the Path Memory Circuit 15

The path memory circuit 15 will be described in detail.
(Configuration of the Path Memory Circuit 15)

Figure 7:
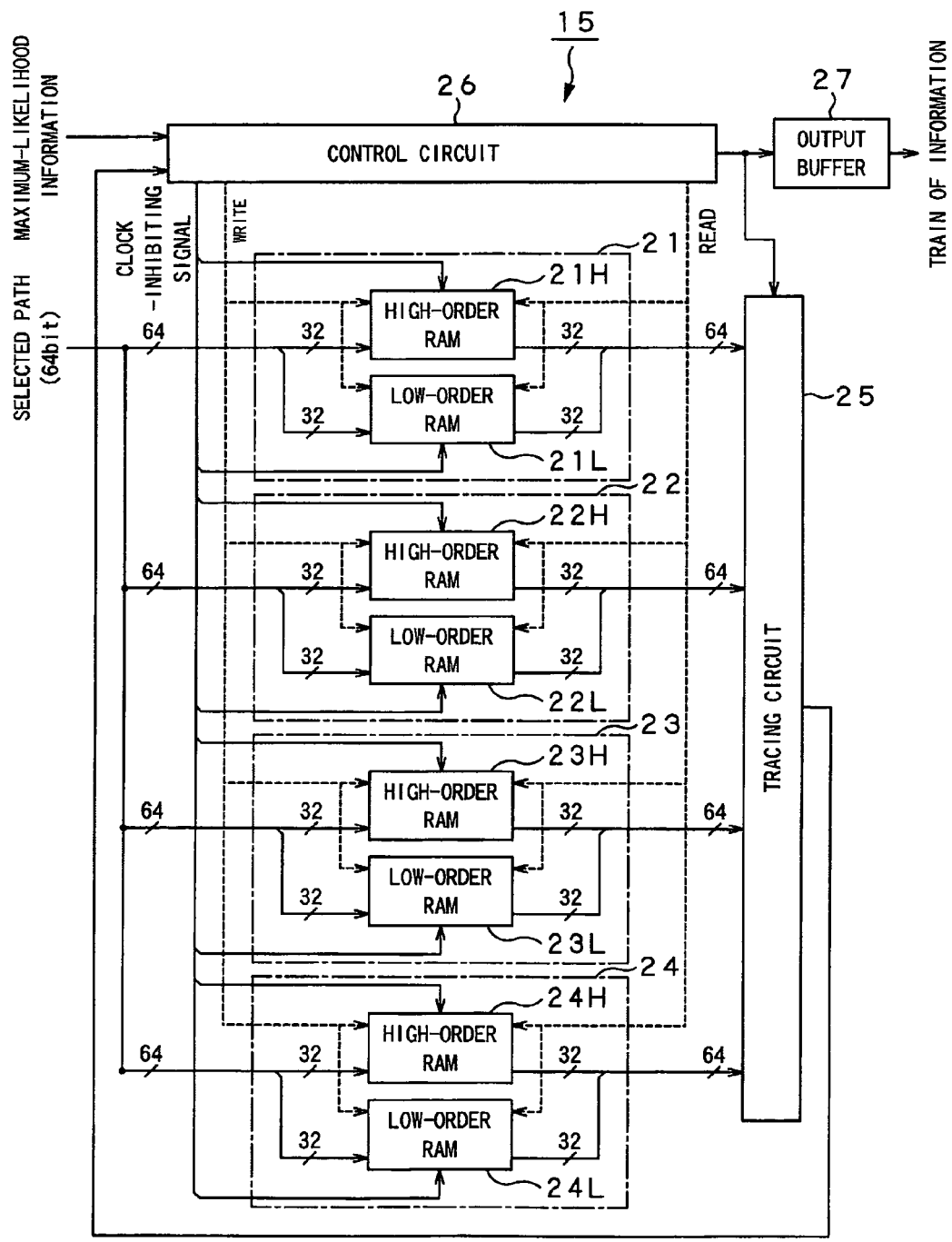
FIG. 7 is a block diagram of the path memory circuit incorporated in the apparatus of FIG. 6.

FIG. 7 is a block diagram of the path memory circuit 15.

The path memory circuit 15 has four memory units 21, 22, 23 and 24, a tracing circuit 25, a control circuit 26, and an output buffer 27. The first to fourth memory units store a selected path each. The tracing circuit 25 traces selected paths. The control circuit 26 controls the other components of the path memory circuit 15. The output buffer 27 stores the result of decoding.

The path memory circuit 15 receives a selected path from the ACS circuit 12 at each sampling.

Each selected path is one that has been selected in accordance with the transition state of a convolution code. Therefore, as many paths as the transitions states each convolution code can assume are selected at a time. The constraint length may be, for example, 7. In this case, each convolution code can assume 64 transitions states. Thus, 64 selected paths are input from the ACS circuit 12 to the memory circuit 15. Since one bit (0 or 1) represents each selected path, as many bits as the transitions states each convolution code can assume are input from the ACS circuit 12 to the path memory circuit 15. (For example, 64 bits are input to the circuit 15 if the constraint length is 7).

The first to fourth memory units 21, 22, 23 and 24 receive a selected path each. The selected path is written into one of the four memory units 21 to 24, which has been designated by a write control signal supplied from the control circuit 26. The four memory units 21, 22, 23 and 24 are selected in sequence, each in one clock cycle. For example, the first memory unit 21, the second memory unit 22, the third memory unit 23 and the fourth memory unit 24 store one selected path each, in the order they are mentioned.

The first to fourth memory units 21, 22, 23 and 24 are each divided into a high-order RAM and a low-order RAM. More precisely, the unit 21 is divided into RAMs 21H and 21L, the unit 22 into RAMS 22H and 22L, the unit 23 into 23H and 23L, and the unit 24 into RAMs 24H and 24L.

Of all selected paths (e.g., 64 selected paths), the paths in high-order transition state are stored in the high-order RAMs 21H, 22H, 23H and 24H. The remaining selected paths, which are in low-order transition state, are stored in the low-order RAMs 21L, 22L, 23L and 24L.

The term "high-order transition state" means any state in which the least significant bit of a bit train that represents the transition state of a convolution code is "1". The term "low-order transition state" means any state in which the least significant bit of a bit train that represents the transition state of a convolution code is "0".

Figure 8:
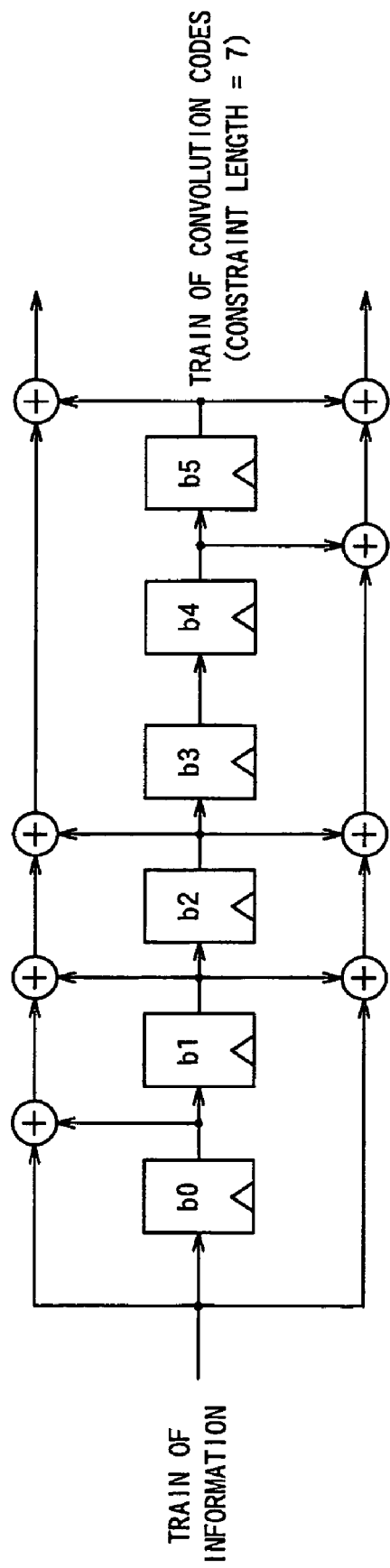
FIG. 8 is a circuit diagram of a convolution encoder in which the constraint length is 7.
Figure 1O:
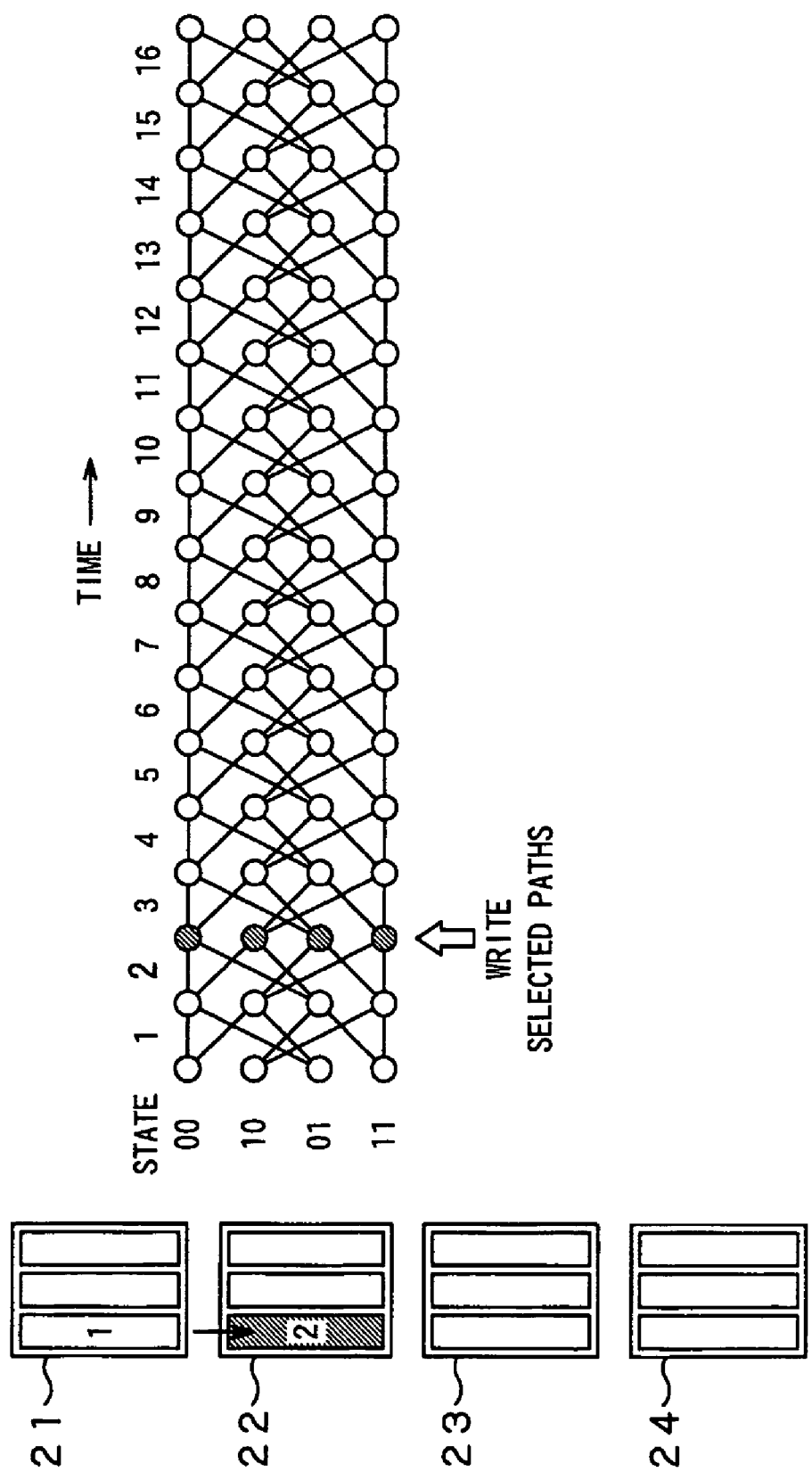

The transition state of any convolution code corresponds to the bits that are stored in the memory elements of a convolution encoder at the specific time. Assume that the constraint length is 7, for example. Then, the convolution encoder has six memory elements b0, b1, b2, b3, b4 and b5 (delay devices) as is illustrated in FIG. 8. Hence, the transition state is defined by whether the bit stored in each of the six memory elements (delay devices) b0 to b5 is 1 or 0.

That is, if a path assumes the "high-order transition state," the last-stage memory element of the encoder (e.g., memory element b5 shown in FIG. 8) will be in the internal state of "1." If a path assumes the "low-order transition state," the last-stage memory element of the encoder (e.g., memory element b5 shown in FIG. 8) will be in the internal state of "1".

Hence, if the constraint length is 7, 32 selected paths whose transition states are represented by the least significant bit "1" will be written in the high-order RAMs 21H, 22H, 23H and 24H, while the 32 selected paths whose transition states are represented by the least significant bit "1" will be written in the low-order RAMs 21L, 22L, 23L and 24L.

As indicated above, each of the memory units 21, 22, 23 and 24 is divided into a high-order RAM and a low-order RAM. The high-order RAM and the low-order RAM can be independently inhibited from reading data. In other words, only one of the two RAMs, either the high-order RAM or the low-order RAM, can be inhibited from reading data. The control circuit 26 supplies a clock-inhibiting signal to the high-order RAMs 21H, 22H, 23H and 24H and to the low-order RAMs 21L, 22L, 23L and 24L. Upon receiving the clock-inhibiting signal, the high-order RAMs 21H, 22H, 23H and 24H and the low-order RAMs 21L, 22L, 23L and 24L stop outputting the data they store.

The tracing circuit 25 reads the selected paths stored in the first to fourth memory units 21, 22, 23 and 24. The paths are traced in sequence in the reversed-time direction, starting with the maximum-likelihood path. The tracing is an operation of examining the paths, one after another, for their transition states at each point of time.

The tracing circuit 25 traces the paths, from the latest time, for the cutoff period. It traces the paths selected before the cutoff period, too. The circuit 25 supplies the result of the path tracing performed prior to the cutoff period, to the control circuit 26.

The control circuit 26 supplies a write control signal to the first to fourth memory units 21, 22, 23 and 24. The write control signal specifies the memory unit to which the selected path input should be written. The control circuit 26 supplies a read control signal, too, to the first to fourth memory units 21, 22, 23 and 24. The read control signal specifies the memory unit from which the selected path should be output to the tracing circuit 25.

Further, the control circuit 26 generates a clock-inhibiting signal to the first to fourth memory units 21, 22, 23 and 24. The clock-inhibiting signal inhibits the data reading from the high-order RAM and low-order RAM of each memory unit.

When the tracing circuit 25 inputs the result of the tracing performed prior to the cutoff period, the control circuit 26 changes the temporal order of the selected paths traced and decodes the information bits. The bits decoded are stored into the output buffer 27.

The output buffer 27 stores the information bits output from the control circuit 26. The output buffer 27 outputs the information bits upon receiving a read request made by an external apparatus.

(Writing and Tracing)

How the selected paths are written into the first to fourth memory units 21 to 24 of the path memory circuit 15 and how the tracing circuit 25 performs the tracing will be explained, with reference to FIGS. 9A to 23B.

The writing and the tracing, which will be described below, are performed by accessing a plurality of memory unit during one clock cycle, in order to trace a plurality of time points during one clock cycle. Thus, the storage capacity can be decreased.

FIGS. 9A to 23A show the data that is written into, and read from, the first to fourth memory units 21 to 24 at time 1. FIGS. 9B to 23B are trellis diagrams, each showing the condition at a specific time.

Although each of the memory units 21, 22, 23 and 24 is divided into a high-order RAM and a low-order RAM, this structural feature is not illustrated in FIGS. 9A to 23A. Why each memory unit is divided into a high-order storage area and a low-order storage area and the advantage resulting from this will be described after the tracing is explained.

For simplicity, a case will be described, wherein the constraint length is 3 for a convolution code to be decoded, and four transition states therefore exist. Nevertheless, the present invention is not limited to this case in which the constraint length is 3.

Selected paths are input to the path memory circuit 15 in each clock cycle. These selected paths correspond to all states existing at the time (4 states if the constraint length is 3; 64 states if the constraint length is 7).

The control circuit 26 generates a write control signal so that the selected paths may be written into one of the four memory units 21 to 24. The memory unit into which the selected paths are written is switched, from one to another, so that the four memory units are cyclically selected, one at a time.

For example, the writing can be carried out as follows.

Figures 12A, 12B:
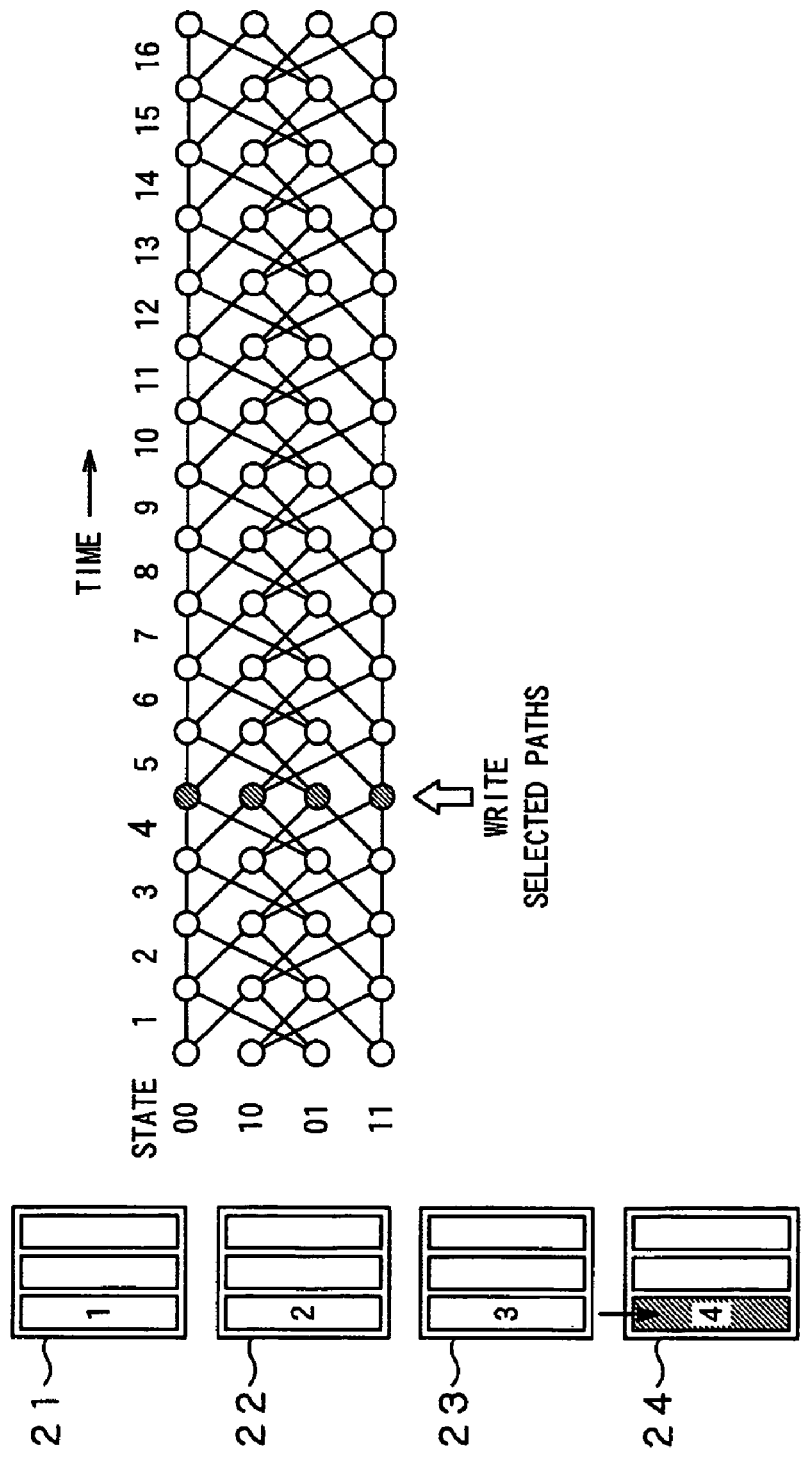
FIG. 12A is a diagram illustrating the data that is written into, and read from, the memory unit at time 4.
FIG. 12B is a trellis diagram showing the condition at time 4.

First, at time 1, four selected paths of four different states, respectively, are written into the first memory unit 21 as shown in FIGS. 9A and 9B. At time 2, four selected paths of four different states, respectively, are written into the second memory unit 22 as illustrated in FIGS. 10A and 10B. At time 3, four selected paths of four different states, respectively, are written into the third memory unit 23 as illustrated in FIGS. 11A and 11B. At time 4, four selected paths of four different states, respectively, are written into the fourth memory unit 24 as illustrated in FIGS. 12A and 12B.

Figures 13A, 13B:
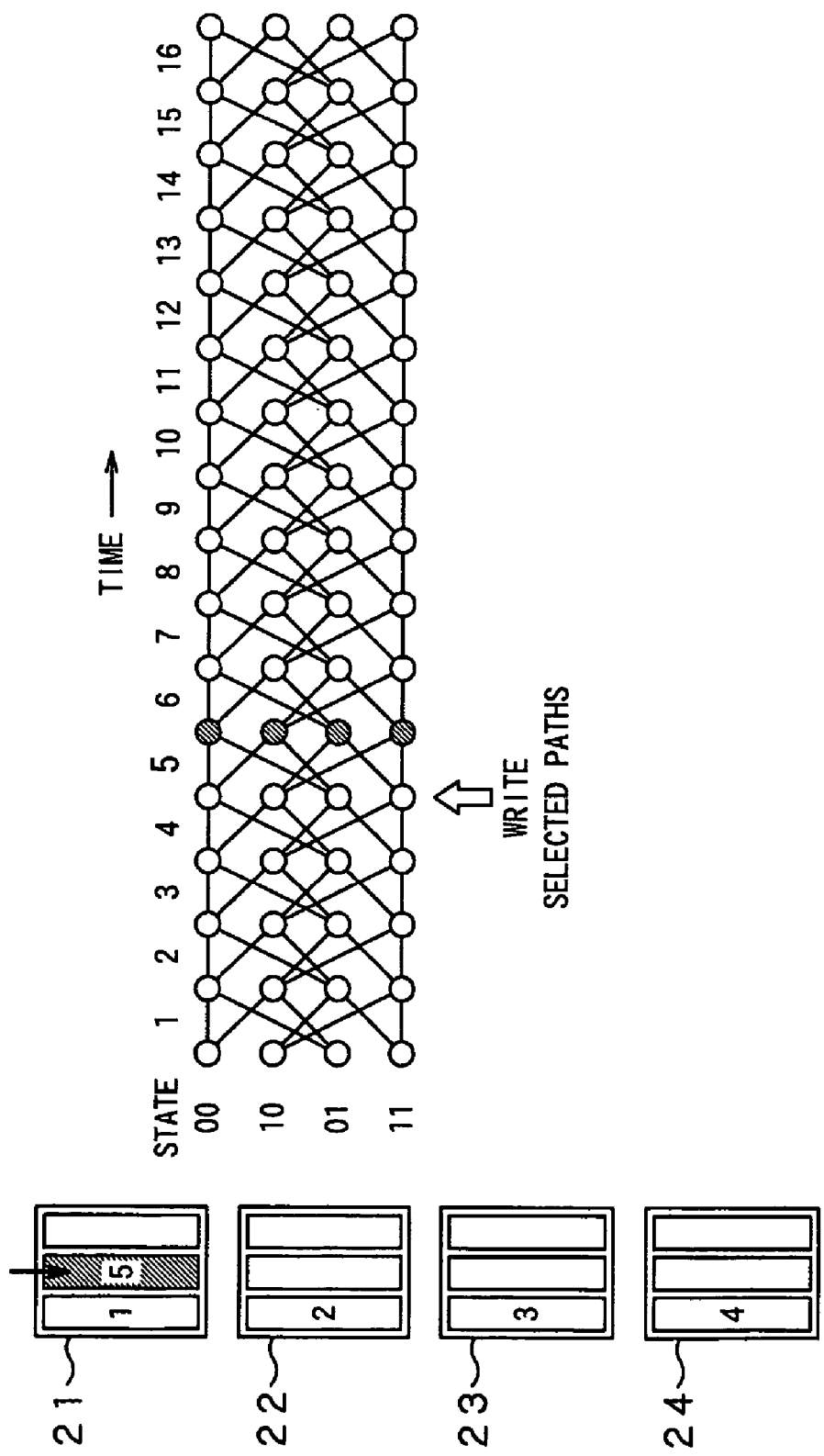
FIG. 13A is a diagram illustrating the data that is written into, and read from, the memory units at time 5.
FIG. 13B is a trellis diagram showing the condition at time 5.
Figures 14A, 14B:
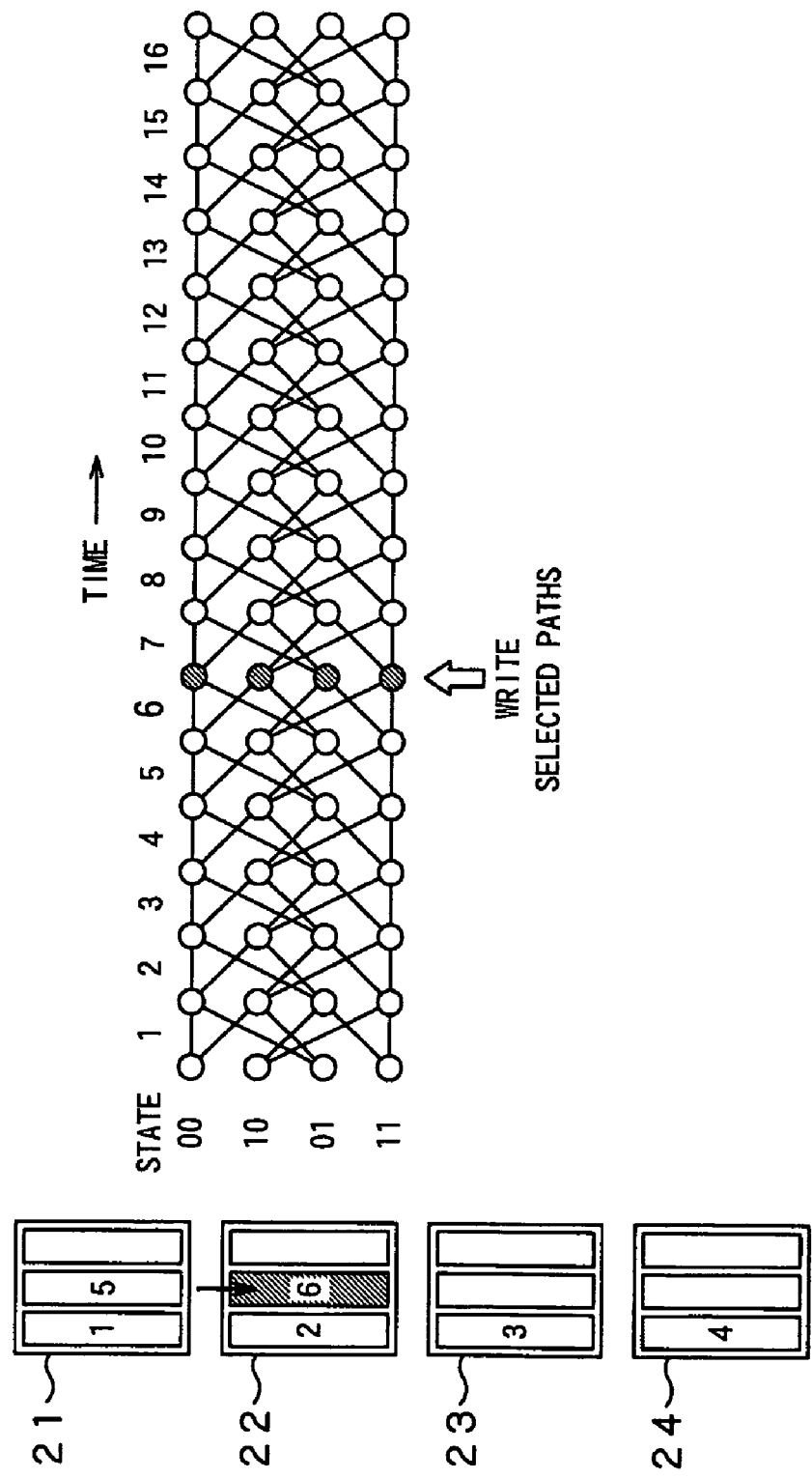
FIG. 14A is a diagram illustrating the data that is written into, and read from, the memory units at time 6.
FIG. 14B is a trellis diagram showing the condition at time 6.
Figures 15A, 15B:
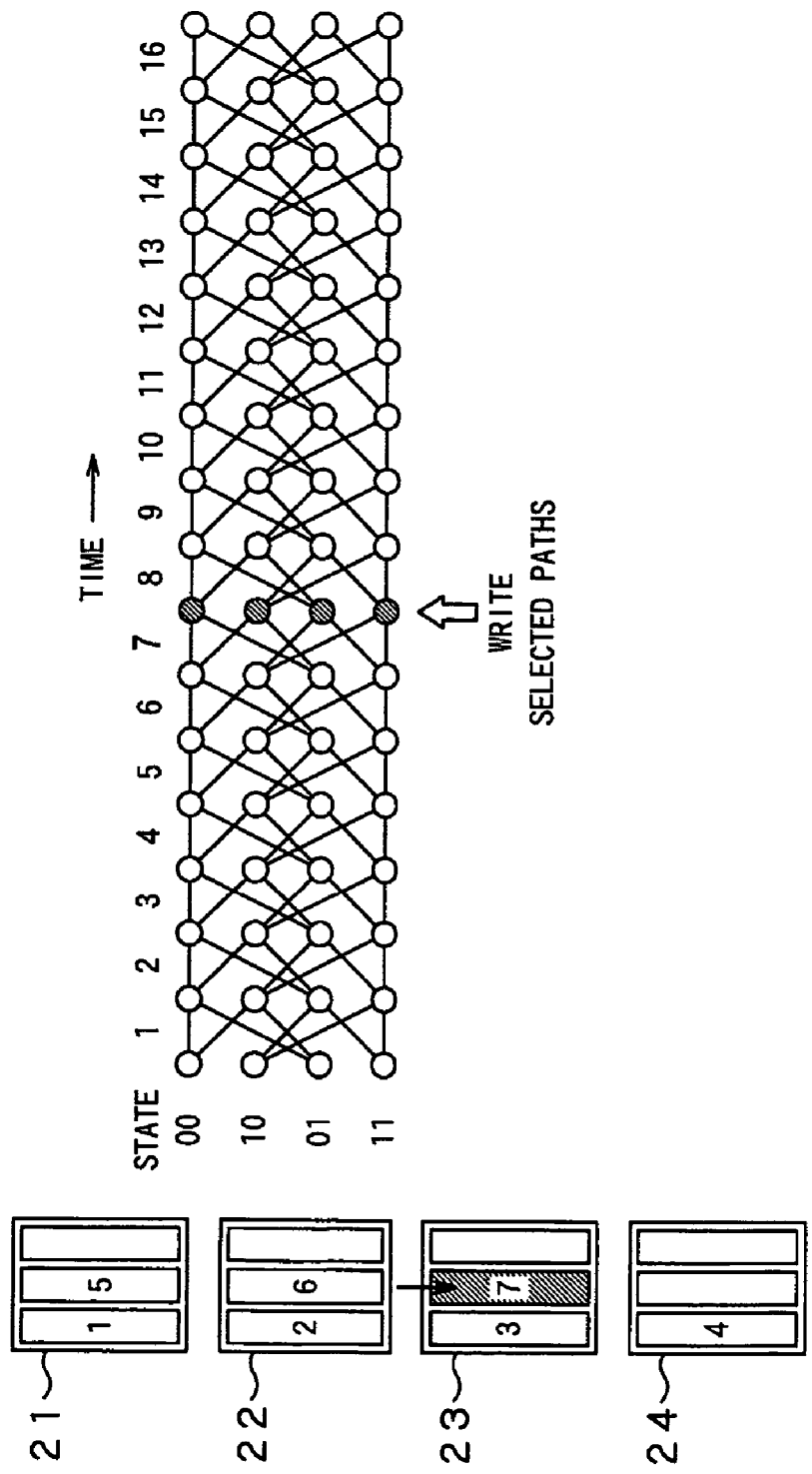
FIG. 15A is a diagram illustrating the data that is written into, and read from, the memory units at time 7.
FIG. 15B is a trellis diagram showing the condition at time 7.
Figures 17A, 17B:
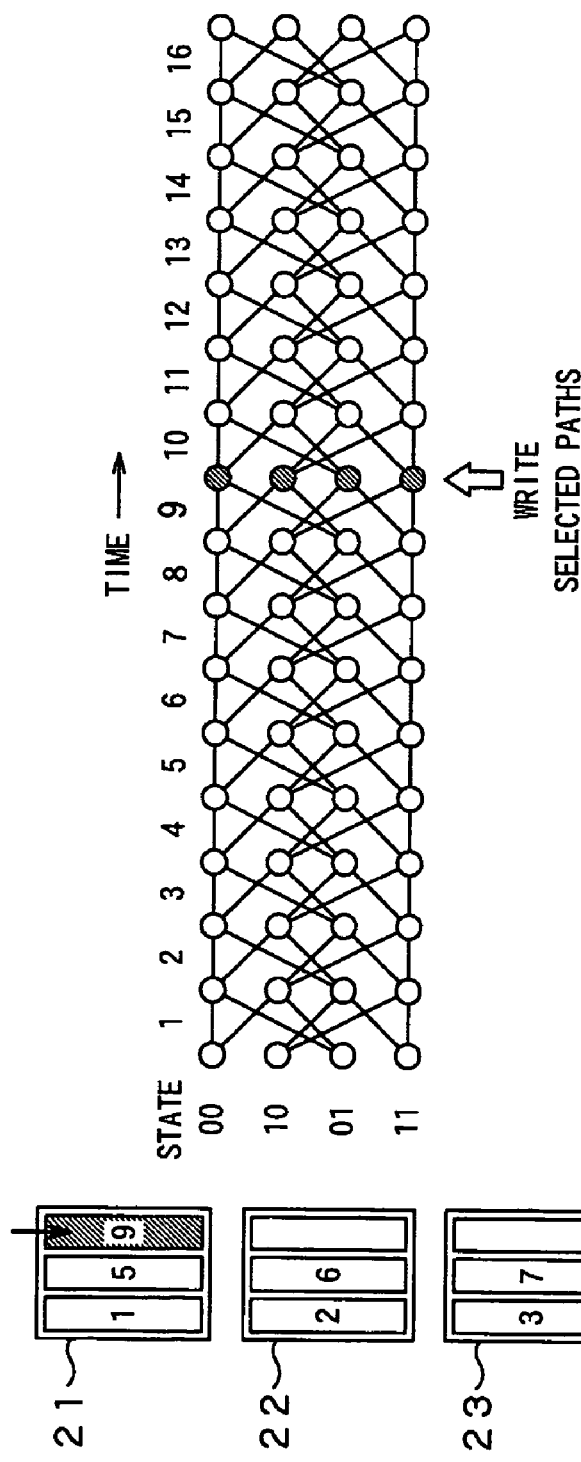
FIG. 17A is a diagram illustrating the data that is written into, and read from, the memory units at time 9.
FIG. 17B is a trellis diagram showing the condition at time 9.

At time 5, four selected paths of four different states, respectively, are written into the first memory unit 21 as shown in FIGS. 13A and 13B.

Thereafter, four selected paths of four different states, respectively, are written into the second memory unit 22, third memory unit 23, fourth memory unit 24 and first memory unit 21, and so on, as illustrated in FIGS. 14A and 14b, FIGS. 15A and 15B, FIGS. 16A and 16B, FIGS. 17A and 17B, respectively.

Once the path memory circuit 15 has stored more selected paths than paths that define the trace-skipping period, the tracing circuit 25 can then start tracing the selected paths.

The circuit 25 traces the selected paths by reading these paths from the memory units in the reversed-time direction.

At this time, the selected paths are sequentially stored in the memory units. Hence, a plurality of selected paths written at different times can be read from the memory units at the same time. At any time, selected paths are being written into one of the memory cell units. Therefore, selected paths can be read from all memory units but one. In the present embodiment, selected paths can be simultaneously read from three memory units, because data is being written into the remaining one memory unit.

More specifically, the reading is accomplished as follows.

Figures 18A, 18B:
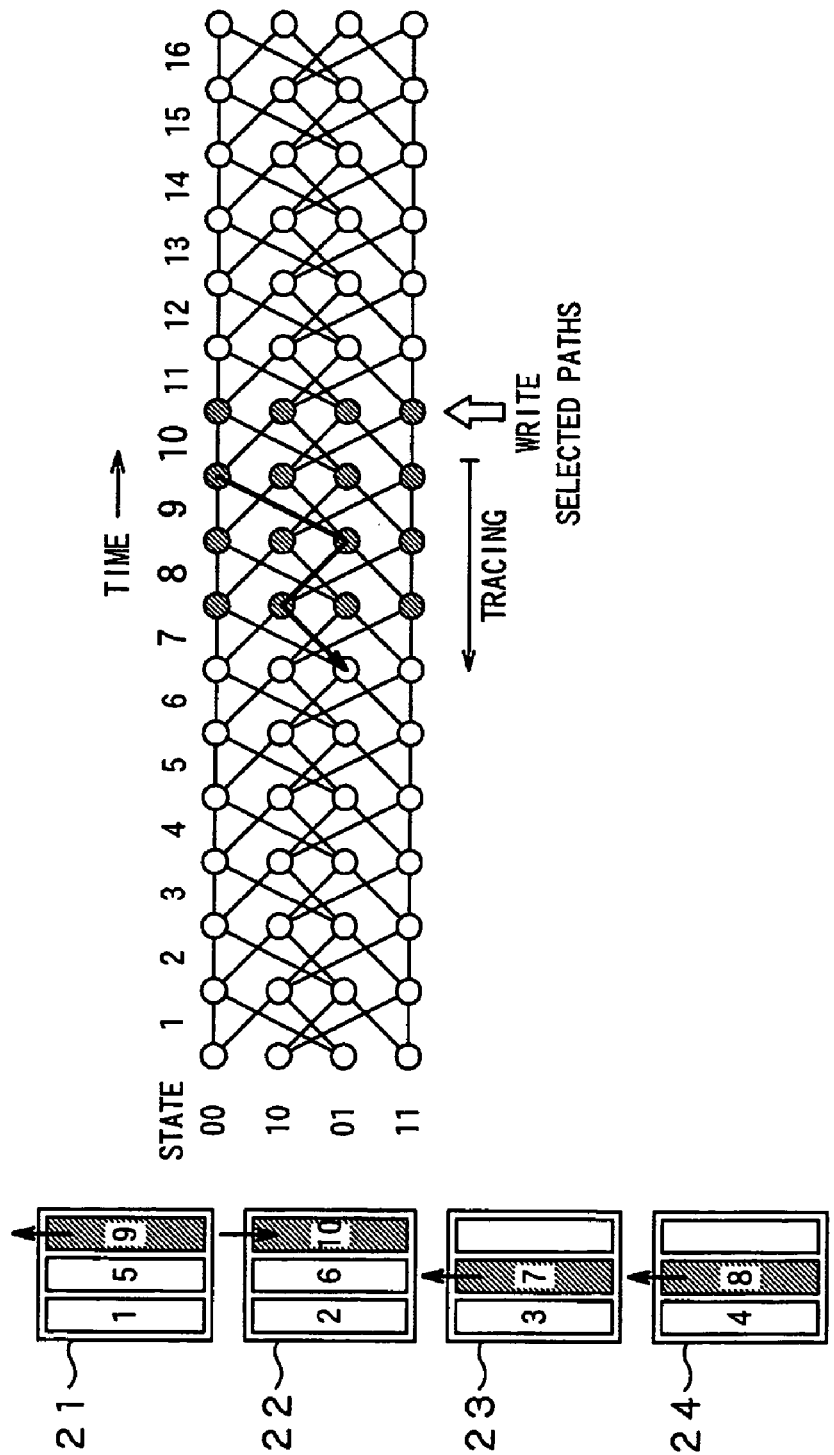
FIG. 18A is a diagram illustrating the data that is written into, and read from, the memory units at time 10.
FIG. 18B is a trellis diagram showing the condition at time 10.

First, at time 10, four paths of four different states, selected at time 10, are written into the second memory unit 22 as shown in FIGS. 18A and 18B. At the same time, the tracing circuit 25 reads the paths selected at time 9, time 8 and time 7, from the first, fourth and third memory units 21, 24 and 23, respectively. Thus, the circuit 25 traces the selected paths in the reversed-time direction, first at time 9, then at time 8 and finally at time 7, by using the maximum-likelihood information as initial state.

Figures 19A, 19B:
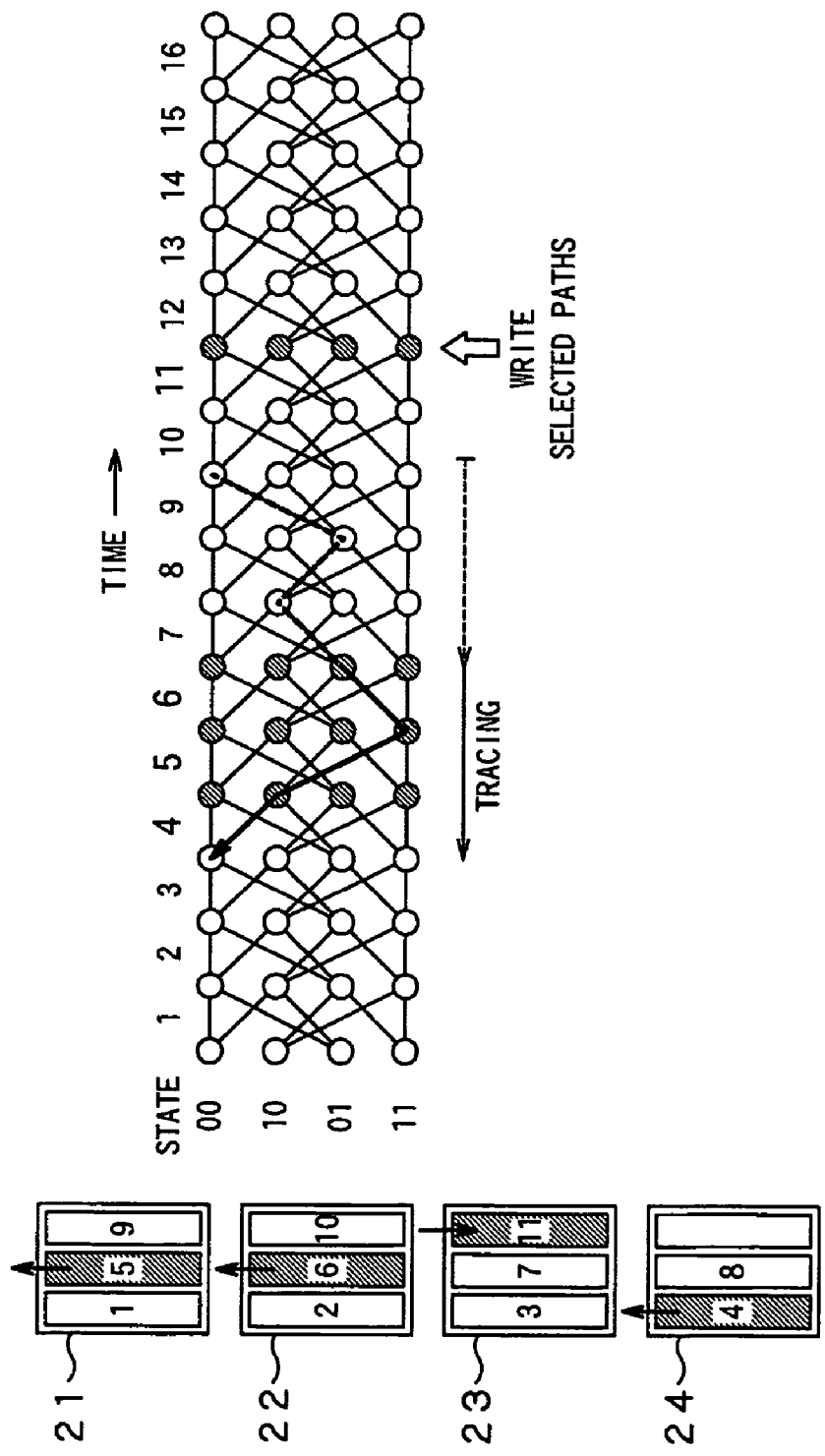
FIG. 19A is a diagram illustrating the data that is written into, and read from, the memory units at time 11.
FIG. 19B is a trellis diagram showing the condition at time 11.

At time 11, four paths of four different states, selected at time 11, are written into the third memory unit 23 as shown in FIGS. 19A and 19B. At the same time, the tracing circuit 25 reads the paths selected at time 6, time 5 and time 4, from the second, first and fourth memory units 22, 21 and 24, respectively. Namely, the circuit 25 traces the selected paths in the reversed-time direction, first at time 6, then at time 5 and finally at time 4, after tracing the selected paths at time 7.

As a result, the tracing is carried on at time 9, time 8, time 7, time 6, time 5 and time 4. The tracing is therefore completed for the trace-skipping period.

Figures 20A, 20B:
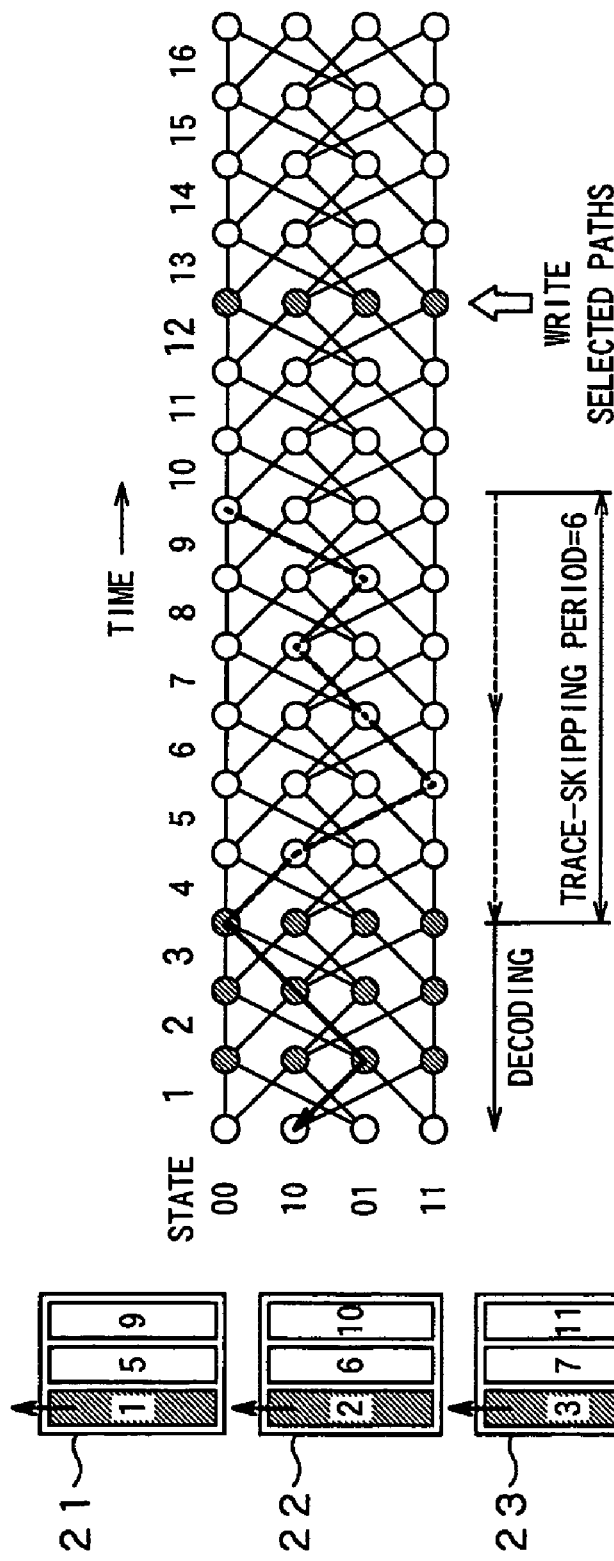
FIG. 20A is a diagram illustrating the data that is written into, and read from, the memory units at time 12.
FIG. 20B is a trellis diagram showing the condition at time 12.
Figures 21A, 21B:
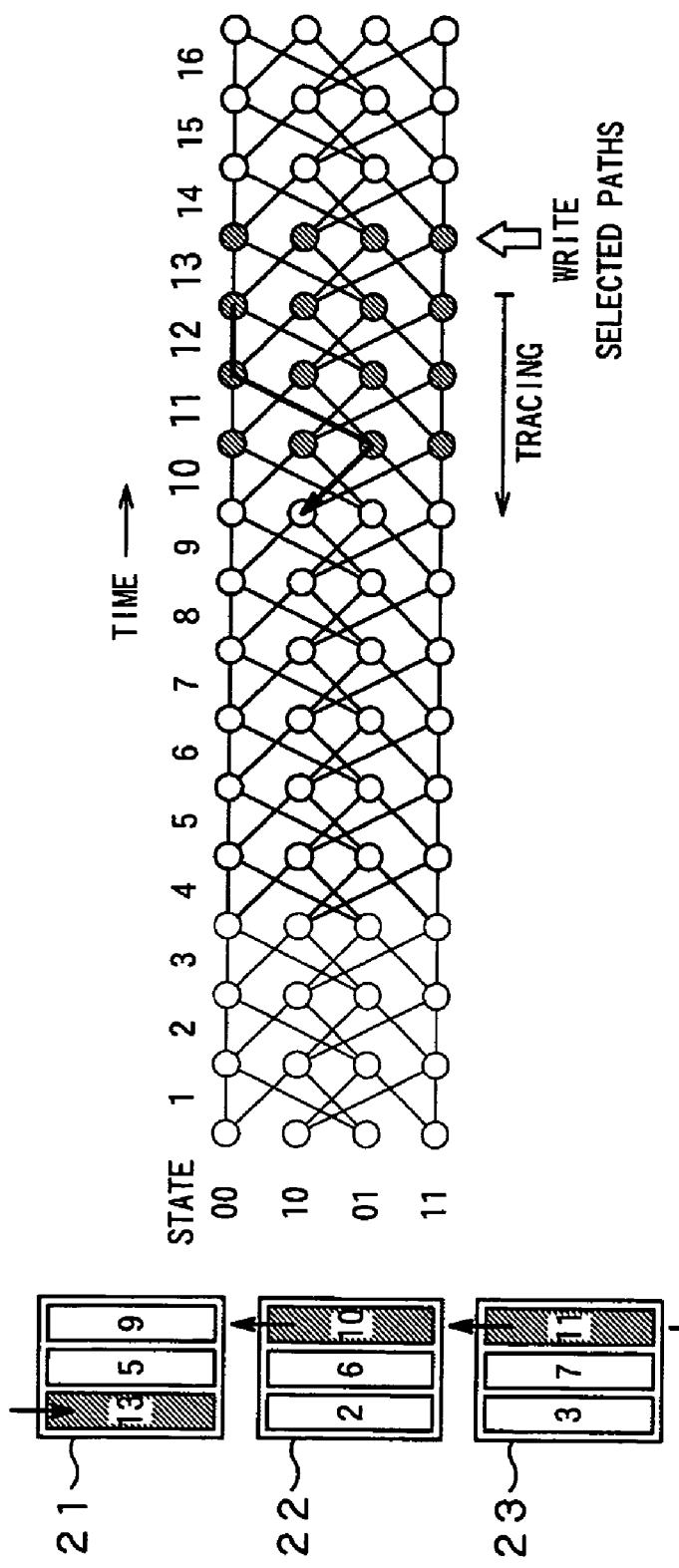
FIG. 21A is a diagram illustrating the data that is written into, and read from, the memory units at time 13.
FIG. 21B is a trellis diagram showing the condition at time 13.
Figures 22A, 22B:
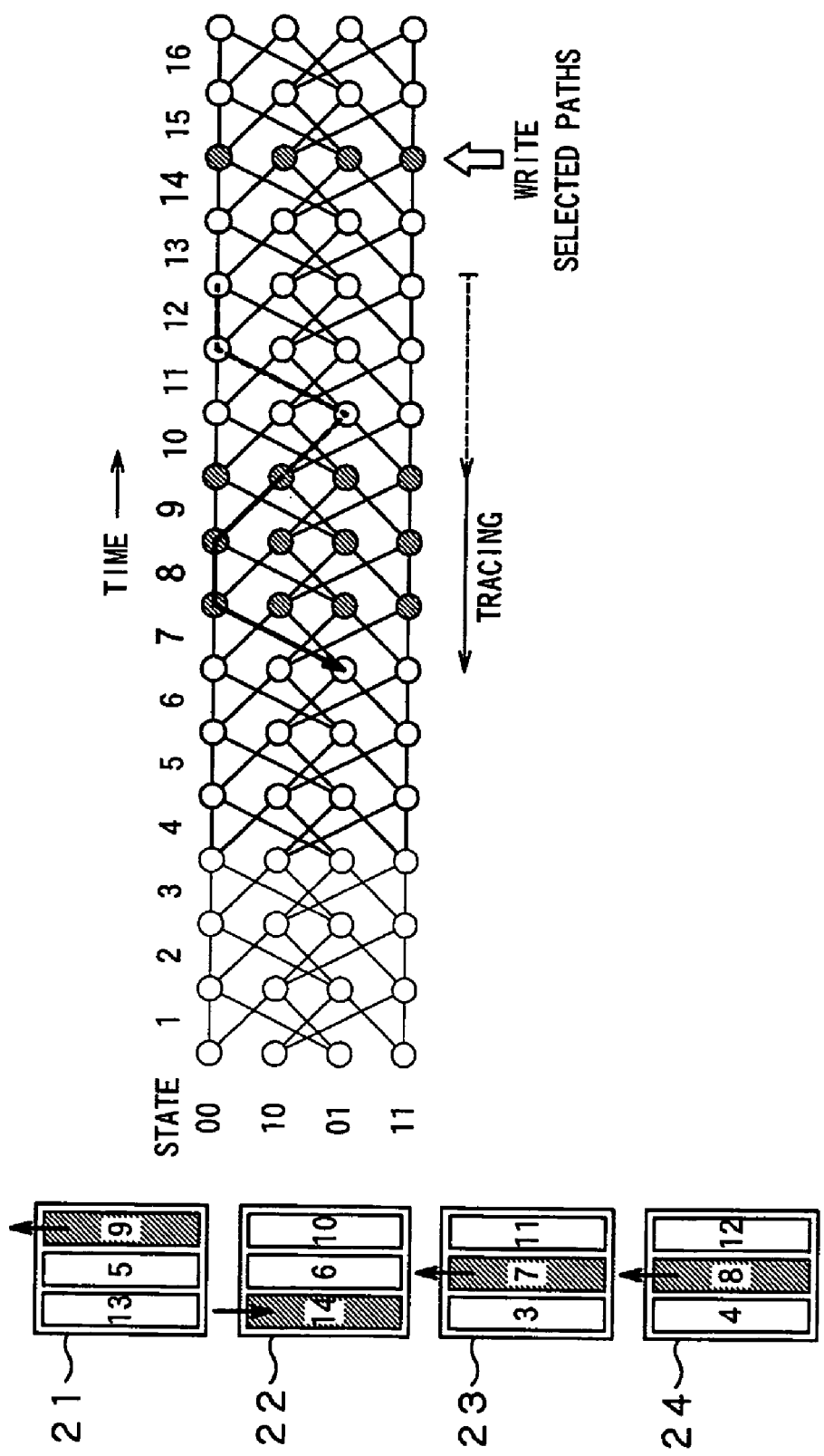
FIG. 22A is a diagram illustrating the data that is written into, and read from, the memory units at time 14.
FIG. 22B is a trellis diagram showing the condition at time 14.
Figures 23A, 23B:
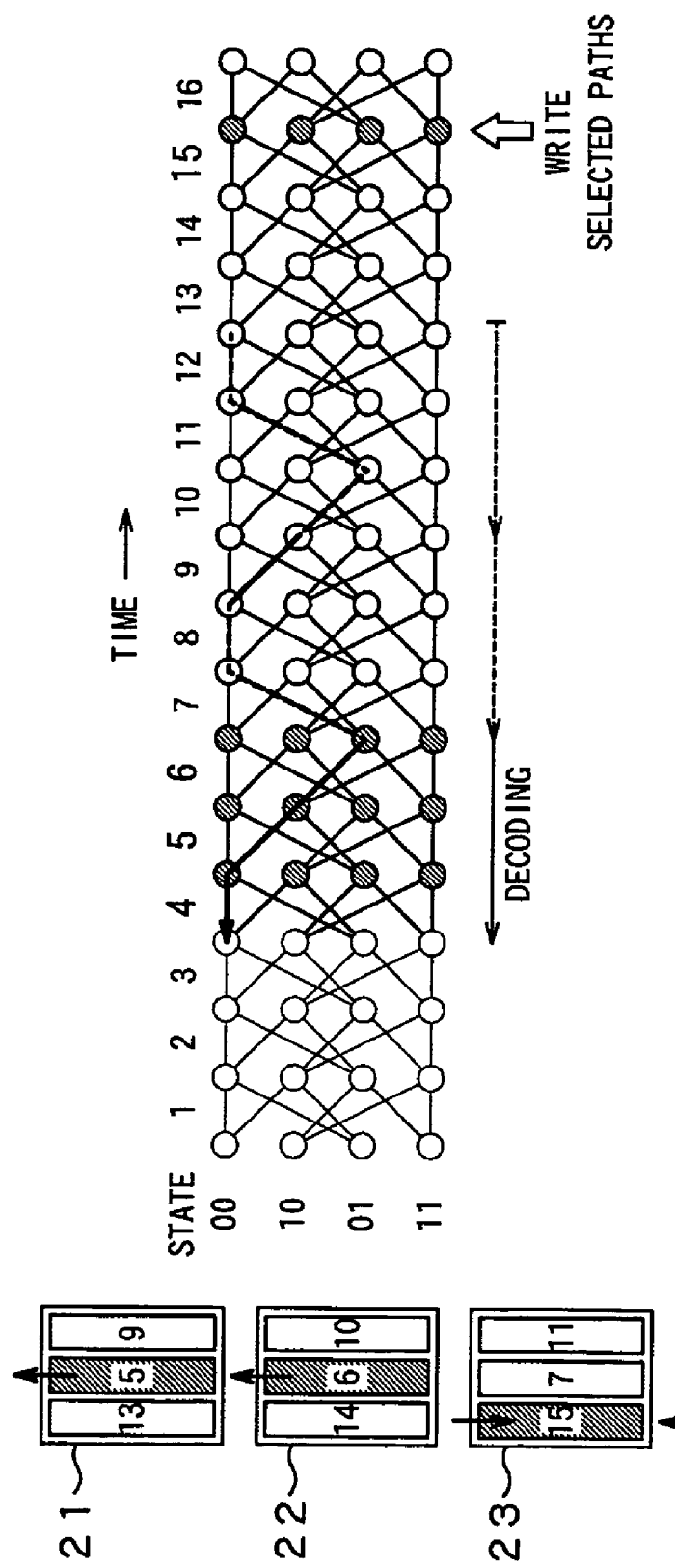
FIG. 23A is a diagram illustrating the data that is written into, and read from, the memory units at time 15.
FIG. 23B is a trellis diagram showing the condition at time 15.

At time 12, four paths of four different states, selected at time 12, are written into the fourth memory unit 24 as shown in FIGS. 20A and 20B. At the same time, the tracing circuit 25 reads the paths selected at time 3, time 2 and time 1, from the third, second and first memory units 23, 22 and 21, respectively. Namely, the circuit 25 traces the selected paths in the reversed-time direction, first at time 3, then at time 2 and finally at time 1, after tracing the selected paths at time 4.

The result of tracing performed at time 3, time 2 and time 1 is the results of tracing the selected paths prior to the trace-skipping period. The tracing circuit 25 therefore supplies the result of tracing performed at time 3, time 2 and time 1 to the control circuit 26. The control circuit 26 rearranges the least significant bits of the three states specified by the tracing results obtained at time 3, time 2 and time 1, thereby decoding the selected paths. The result of the decoding is stored into the buffer circuit 27.

At time 13 and thereafter, selected paths are written and traced (decoded) repeatedly, as illustrated in FIGS. 21A and 21B, FIGS. 22A and 22B and FIGS. 23A and 23B. Thus, the decoding proceeds.

As described above, the paths selected at a plurality of time points can be read during one clock cycle in the path memory circuit 15, in the course of tracing and decoding the selected paths by the trace-back method. This can greatly decrease the storage capacity required.

To be more specific, the first to fourth memory units 21, 22, 23 and 24 only need to have a storage capacity large enough to store selected paths for half (½) the trace-skipping period. Thus, they suffice to store selected paths for at least three words if the trace-skipping period is 6.

(Power Saving in Reading, Because of Memory Division)

A method of saving power in the course of reading selected paths from the first to fourth memory units 21, 22, 23 and 24 of the path memory circuit 15 will be explained below.

The first to fourth memory units 21, 22, 23 and 24 are divided, each into a region (high-order RAM) for holding a selected path of the state whose least significant bit is "1", and a region (low-order RAM) for holding a selected path of the state whose least significant bit is "0".

The selected paths that should be traced (or decoded) are only those assuming one of four states if the constraint length is 3, or assuming one of 64 states if the constraint length is 7. Hence, only one of the high- and low-order RAMs stores the selected paths to be traced (or decoded), and the other RAM does not store any selected path to be traced.

In the path memory circuit 15, the control circuit 26 supplies a clock-inhibiting signal to only one of the high- and low-order RAMs of each memory unit, from which no data needs to be read. Thus, the reading control is performed on each memory unit when selected paths to be traced (or decoded) are read from each memory unit.

Since no selected paths are read from any RAM that has received the clock-inhibiting signal, the path-selection information output is a signal that cannot be referred to. Therefore, the selected paths assuming any state and stored in any RAM that has received the clock-inhibiting signal will not be traced and will not influence the result of decoding. Nevertheless, the number of bits read from each RAM is reduced to half as a whole, and the power consumed to read selected paths from each RAM decreases to almost half.

At time 10, selected paths assuming state "00" at time 9 are read from, for example, only the low-order RAM 21L of the first memory unit 21 as illustrated in FIGS. 24A and 24B. In this case, only the low-order RAM 21L is operated and the reading from the high-order RAM 21H is inhibited. In the fourth memory unit 24 which outputs selected paths assuming the state "01" at time 8, the reading from the low-order RAM 24L is inhibited, and the high-order RAM 24H is operated. In the third memory unit 23 which outputs selected paths assuming the state "10" at time 7, only the low-order RAM 23L is operated, and the reading from the high-order RAM 23H is inhibited.

At time 10, selected paths are being written into the second memory unit 22. Therefore, data is not inhibited from being read from the second memory unit 22.

It can be determined, as follows, which RAM, the high-order RAM or the low-order RAM, can be stopped (that is, from which RAM the selected paths can be read from to be traced).

The convolution encoder (FIG. 8) having a constraint length of 7 and widely used in digital broadcasting has a shift register composed of six memory elements (i.e., delay devices). These memory elements store bits b0, b1, b2, b3, b4 and b5, respectively. (The content of each element is either 0 or 1.) Thus, the state of a convolution code can be expressed as {b5, b4, b3, b2, b1, b0}. The convolution code can assume one of sixty-four states, i.e., {0, 0, 0, 0, 0, 0} to {1, 1, 1, 1, 1, 1}.

In the path memory circuit 15, the tracing is performed for three time points during one clock cycle. Assume that the state is {b5, b4, b3, b2, b1, b0} at the time the tracing is started. There are two states that can be traced one time unit before the tracing is started, i.e., {0, b5, b4, b3, b2, b1} and {1, b5, b4, b3, b2, b1}. There are four states that can be traced two time units before the start of tracing, i.e., {0, 0, b5, b4, b3, b2}, {0, 1, b5, b4, b3, b2}, {1, 0, b5, b4, b3, b2}, and {1, 1, b5, b4, b3, b2}.

Figure 25:
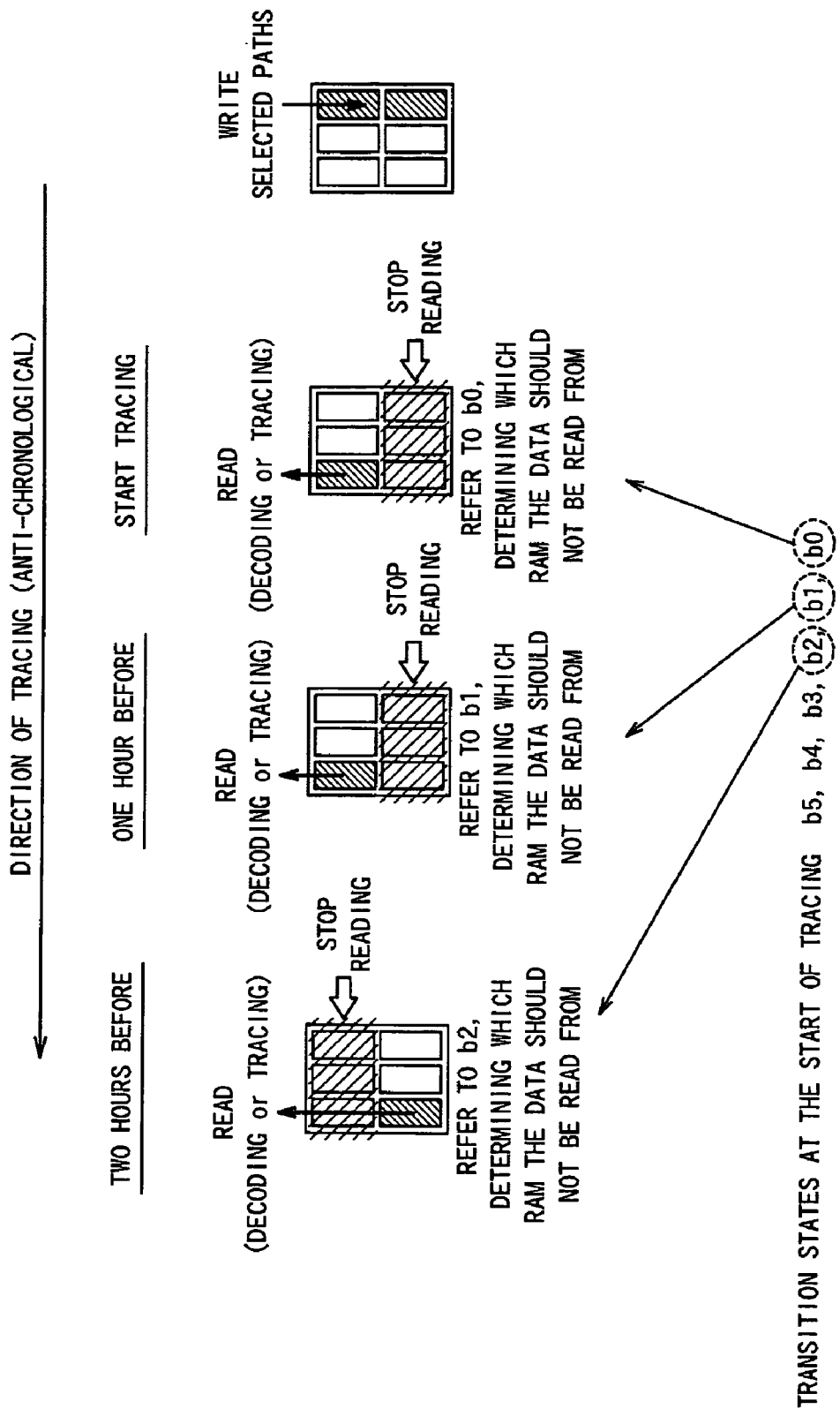
FIG. 25 is a transition diagram depicting the positions of bits that are referred to, in order to select a RAM for which data-reading should be interrupted.

As shown in FIG. 25, if the least significant bit b0 of the state is 1 at the start of tracing, the high-order RAM stores the selected path to be traced (or decoded) at the start of tracing. If the least significant bit b0 of the state is 0 at the start of tracing, the low-order RAM stores the selected path to be traced (decoded) at the start of tracing. Hence, at the start of tracing (or decoding), the low-order RAM can be stopped if the least significant bit b0 of the state is 1 at the start of tracing, and the high-order RAM can be stopped if the least significant bit b0 of the state is 0 at the start of tracing.

If the second least significant bit b1 of the state is 1 at the start of tracing, the high-order RAM stores the selected path to be traced (or decoded) one time unit before the start of tracing. If the second least significant bit b1 of the state is 0 at the start of tracing, the low-order RAM stores the selected path to be traced (or decoded) one time unit before the start of tracing. Hence, one time unit before the start of tracing (or decoding), the low-order RAM can be stopped if the second least significant bit b1 of the state is 1 at the start of tracing, and the high-order RAM can be stopped if the second least significant bit b1 of the state is 0 at the start of tracing.

If the third least significant bit b2 of the state is 1 at the start of tracing, the high-order RAM stores the selected path to be traced (or decoded) two time units before the start of tracing. If the third least significant bit b2 of the state is 0 at the start of tracing, the low-order RAM stores the selected path to be traced (or decoded) two time units before the start of tracing. Hence, two time units before the start of tracing (or decoding), the low-order RAM can be stopped if the third least significant bit b1 of the state is 1 at the start of tracing, and the high-order RAM can be stopped if the second least significant bit b1 of the state is 0 at the start of tracing.

Thus, the control circuit 26 stops the high-order RAM or the low-order RAM in accordance with a low-order bit of the state of the path that has the maximum likelihood at the start of tracing.

In the embodiment described above, the constraint length is 7. The constraint length is not limited, nonetheless. It can take various values.

The embodiment uses four memory units so that tracing may be performed several times during one clock cycle. The scheme of dividing each memory unit (for storing a selected path) into a high-order RAM and a low-order RAM, thereby to save power in the process of reading data, can be applied to any kind of a path memory circuit based on the trace-back method.

In the embodiment described above, the information about the path selection performed at a particular time is divided into two parts, i.e., a high-order part and a low-order part, at the least significant bit of the state. Instead, the information can be divided into four parts or eight parts in accordance with some consecutive low-order bits including the least significant bit, so that some memory elements may be stopped in the process of reading data.

In the embodiment described above, a clock-inhibiting signal stops RAMs. The RAMs may be stopped by any other various schemes. For example, a gated clock may be used to stop the supplying of the clock signal.

It should be understood by those skilled in the art that various modifications, combinations, sub-combinations and alterations may occur depending on design requirements and other factors insofar as they are within the scope of the appended claims or the equivalents thereof.

What is claimed is:

1. A viterbi decoding apparatus for decoding convolution codes, comprising:
- a path memory unit that stores one of two paths toward respective transition states of a convolution code, as a selected path, for a plurality of continuous time points, the path memory unit comprising:
  - a first memory comprising at least a first sub-area for storing a first high-order transition state and a second sub-area for storing a first low-order transition state; and
  - a second memory comprising at least a third sub-area for storing a second high-order transition state and a fourth sub-area for storing a second low-order transition state;
- a tracing unit configured to trace a selected path stored in the path memory unit in a reversed-time direction, thereby decoding a convolution code at respective time points; and
- a control unit configured to control:
  - a writing process at the first memory at a first time point such that both the first sub-area and the second sub-area are subject to writing; and
  - a reading process at the second memory at a second time point such that one of the third sub-area or the fourth sub-area is subject to reading while the other one of the third sub-area or the fourth sub-area is not subject to reading,
- wherein the first time point is later in time than the second time point.

2. The viterbi decoding apparatus according to claim 1, wherein
the first and second memories store selected paths at a time point equal to or more than at least half the trace-skipping period, and the selected paths being cyclically written into the first and second memories.

3. The viterbi decoding apparatus according to claim 1, wherein the control unit refers to a predetermined number of bits from the lowest order of transition state at the start of the tracing, thereby designating at least the fourth sub-area from which no selected path needs to be read at respective time point.

4. The viterbi decoding apparatus according to claim 1, wherein the control unit is configured to send a clock-inhibiting signal to the fourth sub-area so as to stop reading from the fourth sub-area when the reading process is performed at the second memory.

* * * * *